US012696724B2

(12) United States Patent
Roy

(10) Patent No.: US 12,696,724 B2
(45) Date of Patent: Jul. 28, 2026

(54) SYSTEMS, DEVICES, AND METHODS FOR COMPENSATING FOR SHAPE VARIATIONS WHEN USING IMAGE-BASED ALIGNMENT TO ALIGN BONDING PADS

(71) Applicant: CANON KABUSHIKI KAISHA, Tokyo (JP)

(72) Inventor: Nilabh K. Roy, Cedar Park, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 167 days.

(21) Appl. No.: 18/622,154

(22) Filed: Mar. 29, 2024

(65) Prior Publication Data

US 2025/0308965 A1     Oct. 2, 2025

(51) Int. Cl.
G01B 11/30          (2006.01)
G01B 11/16          (2006.01)
H10P 72/50          (2026.01)

(52) U.S. Cl.
CPC .............. H10P 72/53 (2026.01); G01B 11/16 (2013.01); G01B 11/30 (2013.01)

(58) Field of Classification Search
CPC . H01L 21/681; H01L 21/67144; G01B 11/16; G01B 11/30
USPC .................................................. 356/399–401
See application file for complete search history.

(56) References Cited

U.S. PATENT DOCUMENTS 10,460,433 B2 * 10/2019 Tsujikawa .................. G06T 7/11
12,092,967 B2 *  9/2024 Makino .................. G03F 9/7088

2008/0294280 A1 * 11/2008 Okita ............... G05B 19/41875
                                                  257/E21.627
2021/0242059 A1 *  8/2021 Chen ........................ G06T 7/001
2022/0102185 A1 *  3/2022 Lee ........................ H01L 21/681
2024/0186278 A1 *  6/2024 Kajinami .............. H01L 21/681
2025/0062145 A1 *  2/2025 Voleti ........................ G06T 7/73

FOREIGN PATENT DOCUMENTS

CN        114038776 A      2/2022
CN        114975155 A      8/2022
WO         03023846 A1     3/2003

OTHER PUBLICATIONS

B. Srinivasa Reddy, et al.; "An FFT-Based Technique for Translation, Rotation, and Scale-Invariant Image Registration"; IEEE Transactions on Image Processing, vol. 5, No. 8; Aug. 1996; pp. 1266-1271.
Jürgen Burggraf, Bonding Technologies for the Next Generation Integration Schemes, Sep. 2021.

* cited by examiner

*Primary Examiner* — Isiaka O Akanbi

(74) *Attorney, Agent, or Firm* — Canon U.S.A., Inc. IP Division

(57)          ABSTRACT

Some devices, systems, and methods for aligning a chiplet to a substrate obtain an image of a region on a chiplet, measure a deviation from planarity of the region on the chiplet, estimate a chiplet-position error of the chiplet based at least on the image of the region and the deviation from planarity of the region, and adjust a relative position of the chiplet and a substrate based on the chiplet-position error.

19 Claims, 15 Drawing Sheets

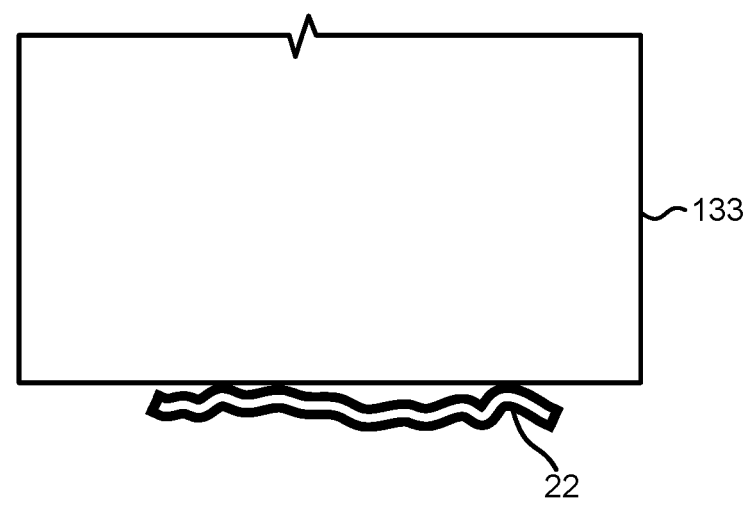
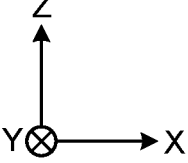
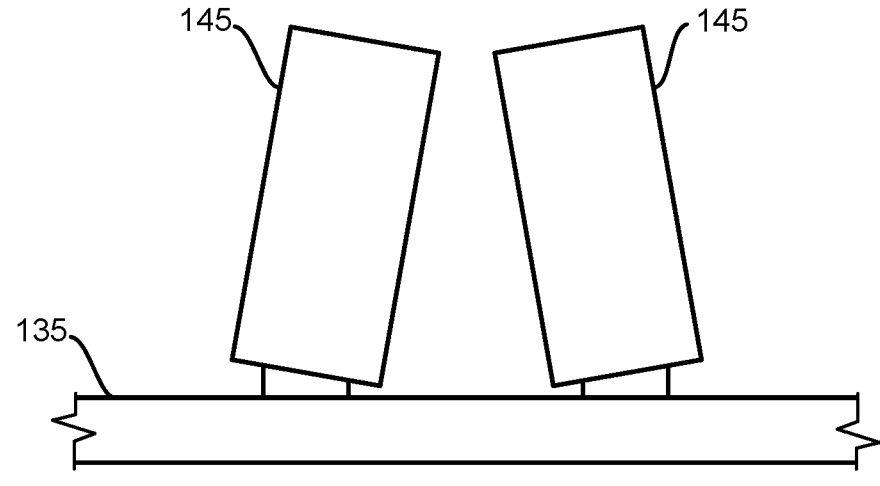
FIG. 8

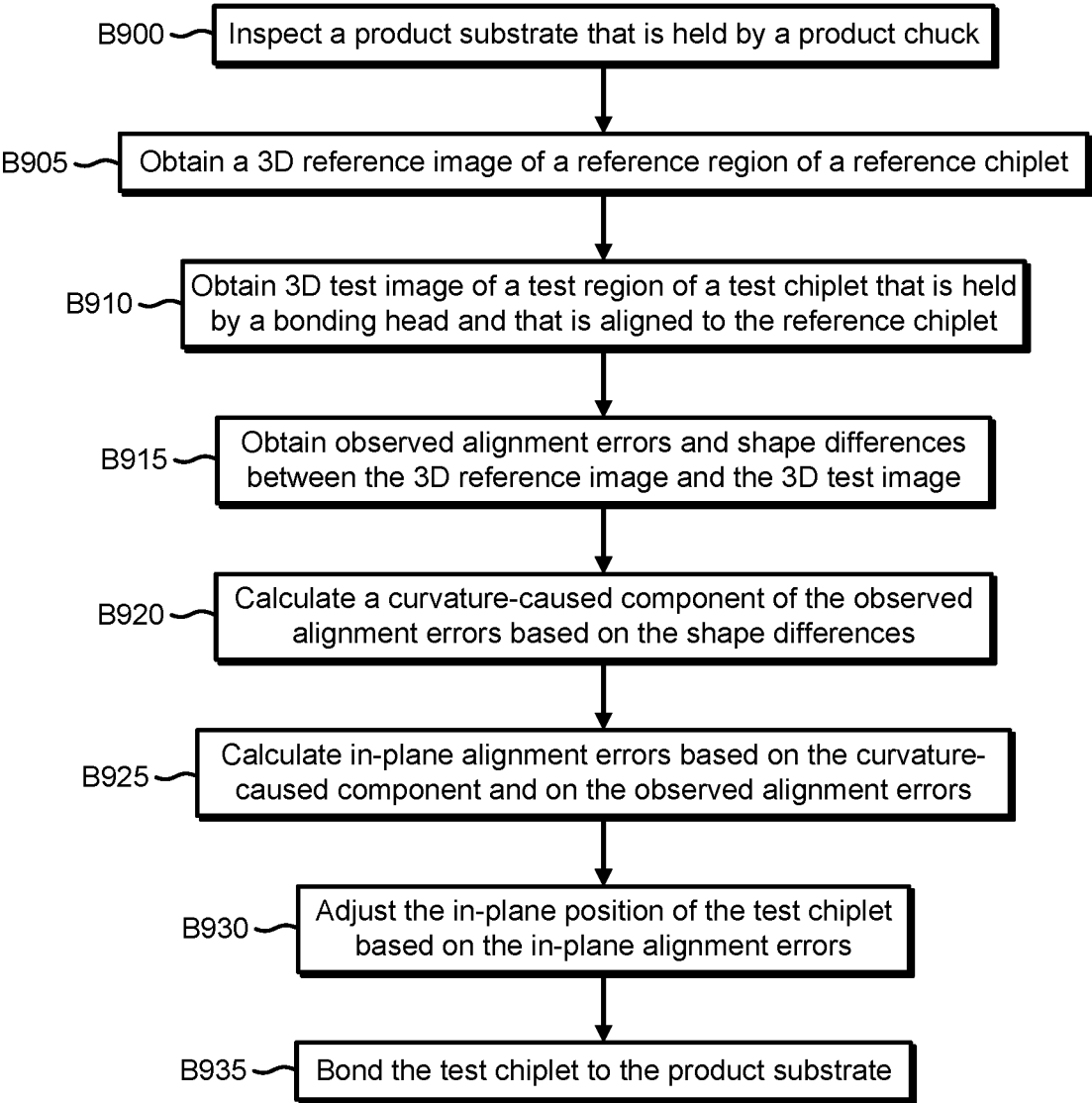

B900 — Inspect a product substrate that is held by a product chuck

B905 — Obtain a 3D reference image of a reference region of a reference chiplet

B910 — Obtain 3D test image of a test region of a test chiplet that is held by a bonding head and that is aligned to the reference chiplet B915 — Obtain observed alignment errors and shape differences between the 3D reference image and the 3D test image B920 — Calculate a curvature-caused component of the observed alignment errors based on the shape differences B925 — Calculate in-plane alignment errors based on the curvature-caused component and on the observed alignment errors B930 — Adjust the in-plane position of the test chiplet based on the in-plane alignment errors B935 — Bond the test chiplet to the product substrate

FIG. 9

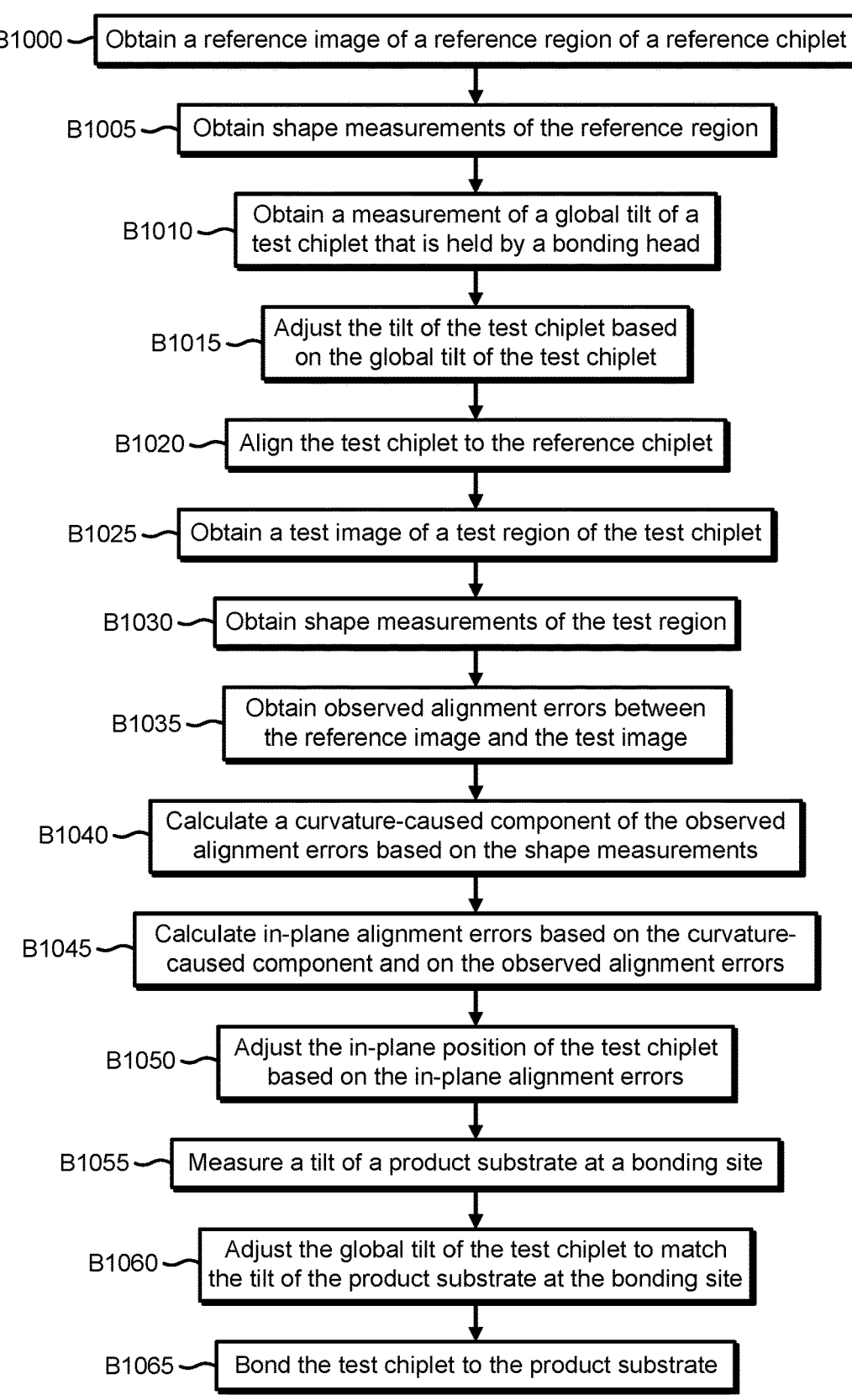

B1000 — Obtain a reference image of a reference region of a reference chiplet

B1005 — Obtain shape measurements of the reference region

B1010 — Obtain a measurement of a global tilt of a test chiplet that is held by a bonding head B1015 — Adjust the tilt of the test chiplet based on the global tilt of the test chiplet B1020 — Align the test chiplet to the reference chiplet B1025 — Obtain a test image of a test region of the test chiplet B1030 — Obtain shape measurements of the test region B1035 — Obtain observed alignment errors between the reference image and the test image B1040 — Calculate a curvature-caused component of the observed alignment errors based on the shape measurements B1045 — Calculate in-plane alignment errors based on the curvature-caused component and on the observed alignment errors B1050 — Adjust the in-plane position of the test chiplet based on the in-plane alignment errors B1055 — Measure a tilt of a product substrate at a bonding site B1060 — Adjust the global tilt of the test chiplet to match the tilt of the product substrate at the bonding site B1065 — Bond the test chiplet to the product substrate

FIG. 10

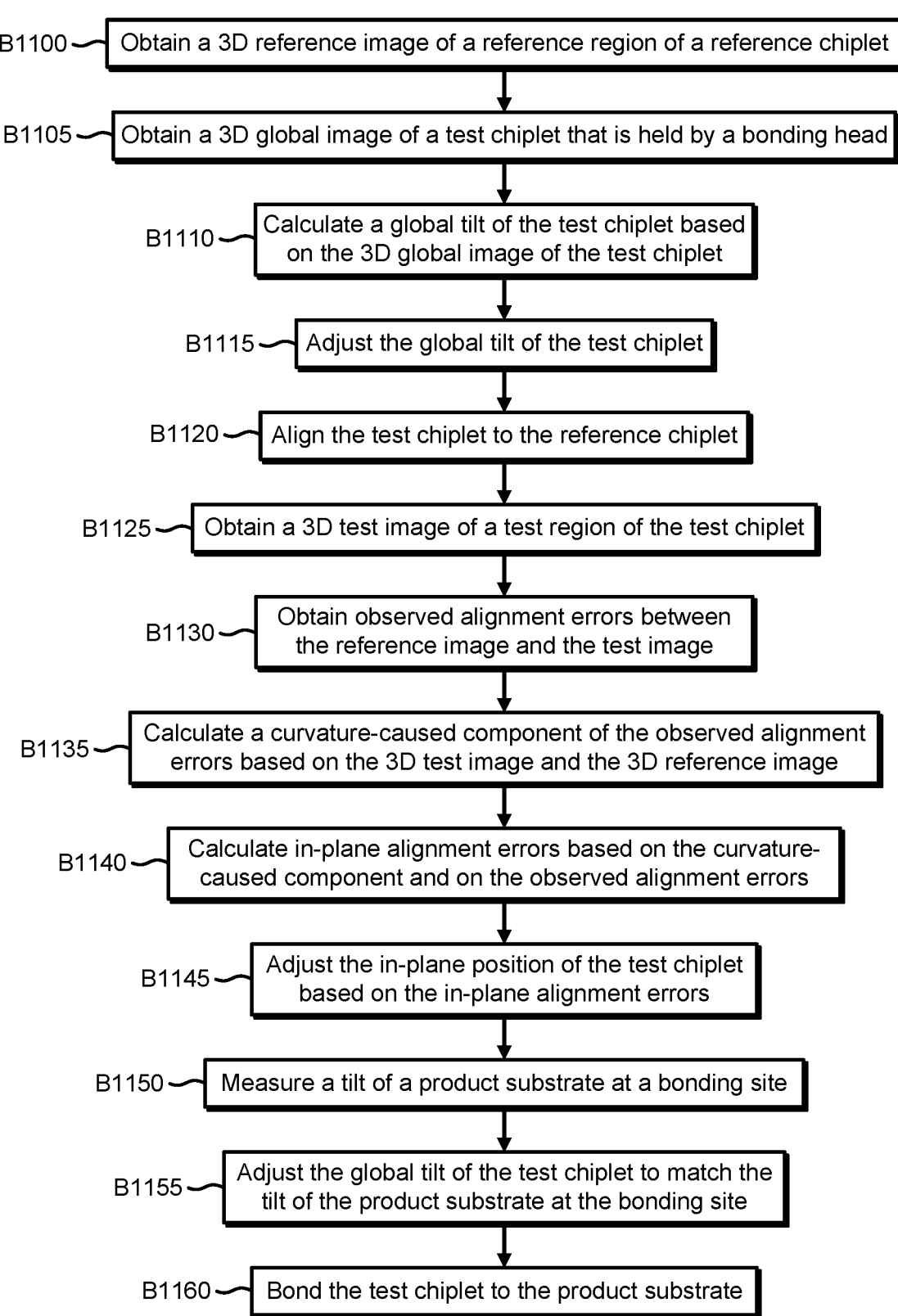

B1100 — Obtain a 3D reference image of a reference region of a reference chiplet B1105 — Obtain a 3D global image of a test chiplet that is held by a bonding head B1110 — Calculate a global tilt of the test chiplet based on the 3D global image of the test chiplet B1115 — Adjust the global tilt of the test chiplet B1120 — Align the test chiplet to the reference chiplet B1125 — Obtain a 3D test image of a test region of the test chiplet B1130 — Obtain observed alignment errors between the reference image and the test image B1135 — Calculate a curvature-caused component of the observed alignment errors based on the 3D test image and the 3D reference image B1140 — Calculate in-plane alignment errors based on the curvature-caused component and on the observed alignment errors B1145 — Adjust the in-plane position of the test chiplet based on the in-plane alignment errors B1150 — Measure a tilt of a product substrate at a bonding site B1155 — Adjust the global tilt of the test chiplet to match the tilt of the product substrate at the bonding site B1160 — Bond the test chiplet to the product substrate

FIG. 11

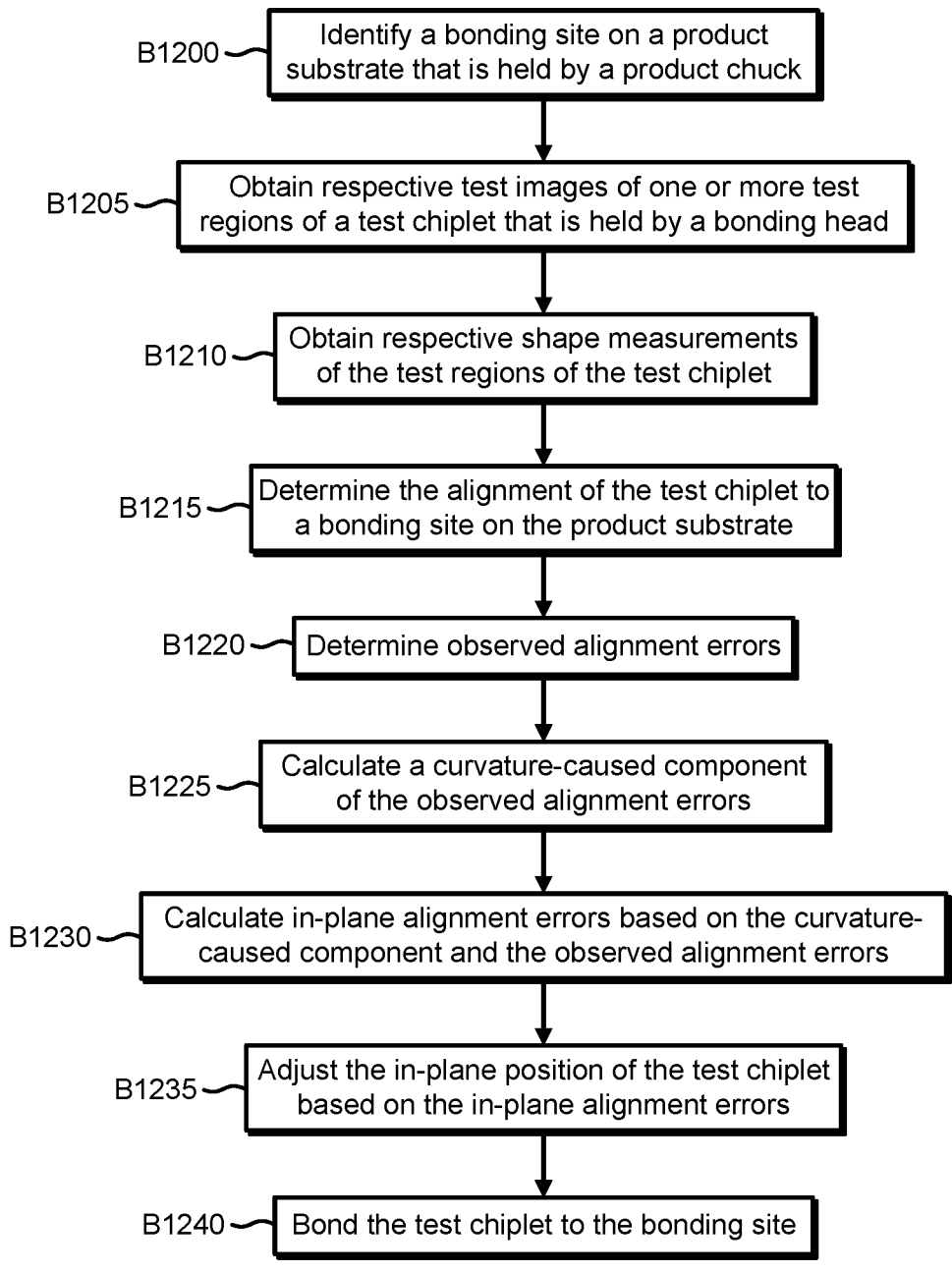

B1200 — Identify a bonding site on a product substrate that is held by a product chuck B1205 — Obtain respective test images of one or more test regions of a test chiplet that is held by a bonding head B1210 — Obtain respective shape measurements of the test regions of the test chiplet B1215 — Determine the alignment of the test chiplet to a bonding site on the product substrate B1220 — Determine observed alignment errors B1225 — Calculate a curvature-caused component of the observed alignment errors B1230 — Calculate in-plane alignment errors based on the curvature-caused component and the observed alignment errors B1235 — Adjust the in-plane position of the test chiplet based on the in-plane alignment errors B1240 — Bond the test chiplet to the bonding site

FIG. 12

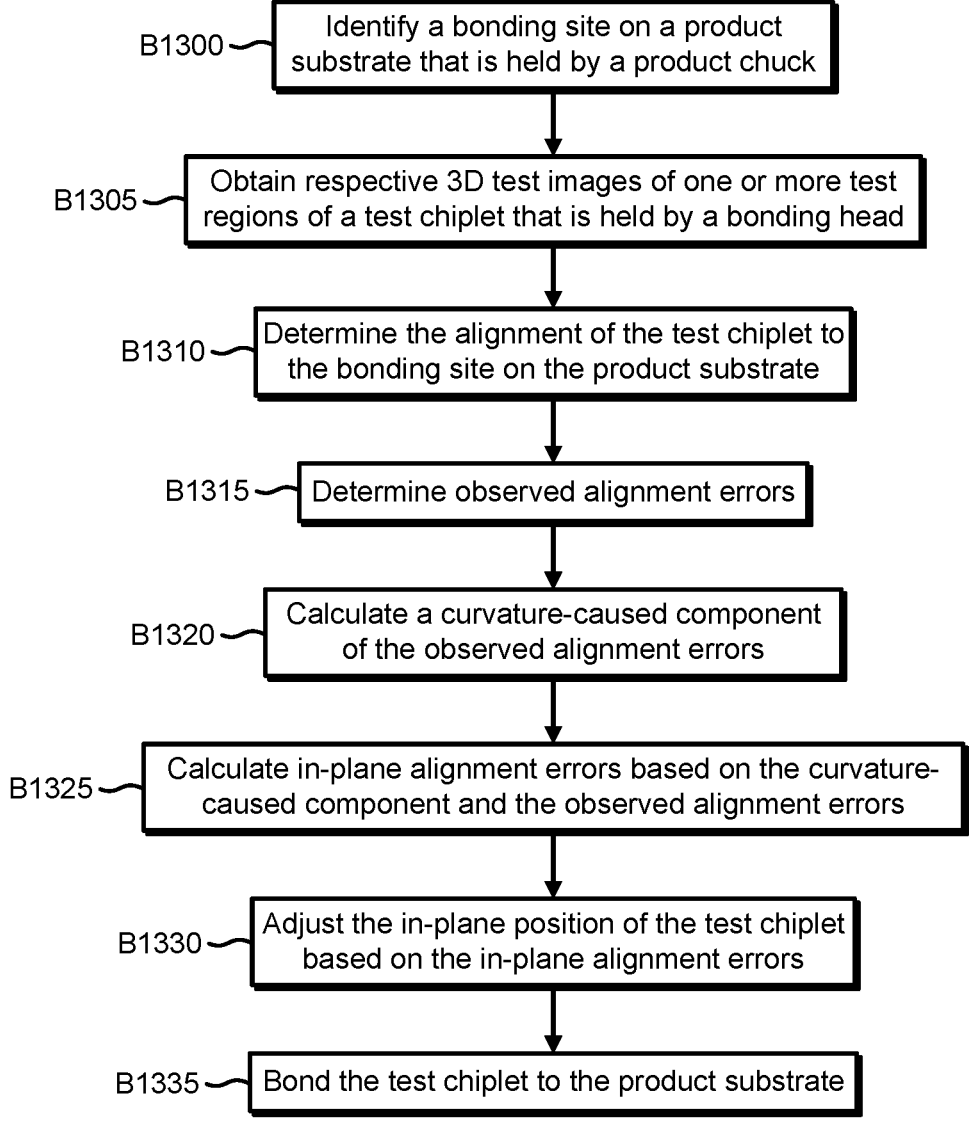

B1300 — Identify a bonding site on a product substrate that is held by a product chuck B1305 — Obtain respective 3D test images of one or more test regions of a test chiplet that is held by a bonding head B1310 — Determine the alignment of the test chiplet to the bonding site on the product substrate B1315 — Determine observed alignment errors B1320 — Calculate a curvature-caused component of the observed alignment errors B1325 — Calculate in-plane alignment errors based on the curvature-caused component and the observed alignment errors B1330 — Adjust the in-plane position of the test chiplet based on the in-plane alignment errors B1335 — Bond the test chiplet to the product substrate

SYSTEMS, DEVICES, AND METHODS FOR COMPENSATING FOR SHAPE VARIATIONS WHEN USING IMAGE-BASED ALIGNMENT TO ALIGN BONDING PADS

BACKGROUND

Technical Field

This application generally concerns aligning chiplets with bonding sites.

Background

The manufacture of devices (e.g., electronic devices) that include multiple components requires that these multiple components be bonded together. One method of bonding these components includes aligning a first set of electrical pads (interconnect contacts) on a first product (e.g., a chiplet) with a second set of electrical pads on a second product (e.g., a substrate). Consequently, the systems and methods that do this alignment may be designed to operate with an accuracy that is a fraction ($\frac{1}{10}$ to $\frac{1}{4}$) of the electrical pads' diameters or the narrowest widths.

SUMMARY

Some embodiments of a method comprise obtaining an image of a region on a chiplet, measuring a deviation from planarity of the region on the chiplet, estimating a chiplet-position error of the chiplet based at least on the image of the region and the deviation from planarity of the region, and adjusting a relative position of the chiplet and a substrate based on the chiplet-position error.

Some embodiments of a system comprise one or more processors and one or more memories. The one or more processors and the one or more memories are configured to obtain an image of a region on a chiplet, measure a deviation from planarity of the region on the chiplet, calculate a chiplet-position error of the chiplet based at least on the image of the region and the deviation from planarity of the region, and adjust a relative position of the chiplet and a substrate based on the chiplet-position error.

Some embodiments of one or more computer-readable storage media store instructions that, when executed by one or more computing devices, cause the one or more computing devices to perform operations that comprise obtaining an image of a region on a chiplet; measuring a surface relief of the region on the chiplet; calculating a chiplet-position error of the chiplet based on at least the image of the region, the surface relief of the region, and a reference surface; and calculating a position-adjustment value for the chiplet based on the chiplet-position error.

BRIEF DESCRIPTION OF THE DRAWINGS

FIG. 8 illustrates an example embodiment of two upward-facing microscopes.

FIG. 9 illustrates an example embodiment of an operational flow for bonding a chiplet to a substrate.

FIG. 10 illustrates an example embodiment of an operational flow for bonding a chiplet to a substrate.

FIG. 11 illustrates an example embodiment of an operational flow for bonding a chiplet to a substrate.

FIG. 12 illustrates an example embodiment of an operational flow for bonding a chiplet to a substrate.

FIG. 13 illustrates an example embodiment of an operational flow for bonding a chiplet to a substrate.

DESCRIPTION

Figure 1:
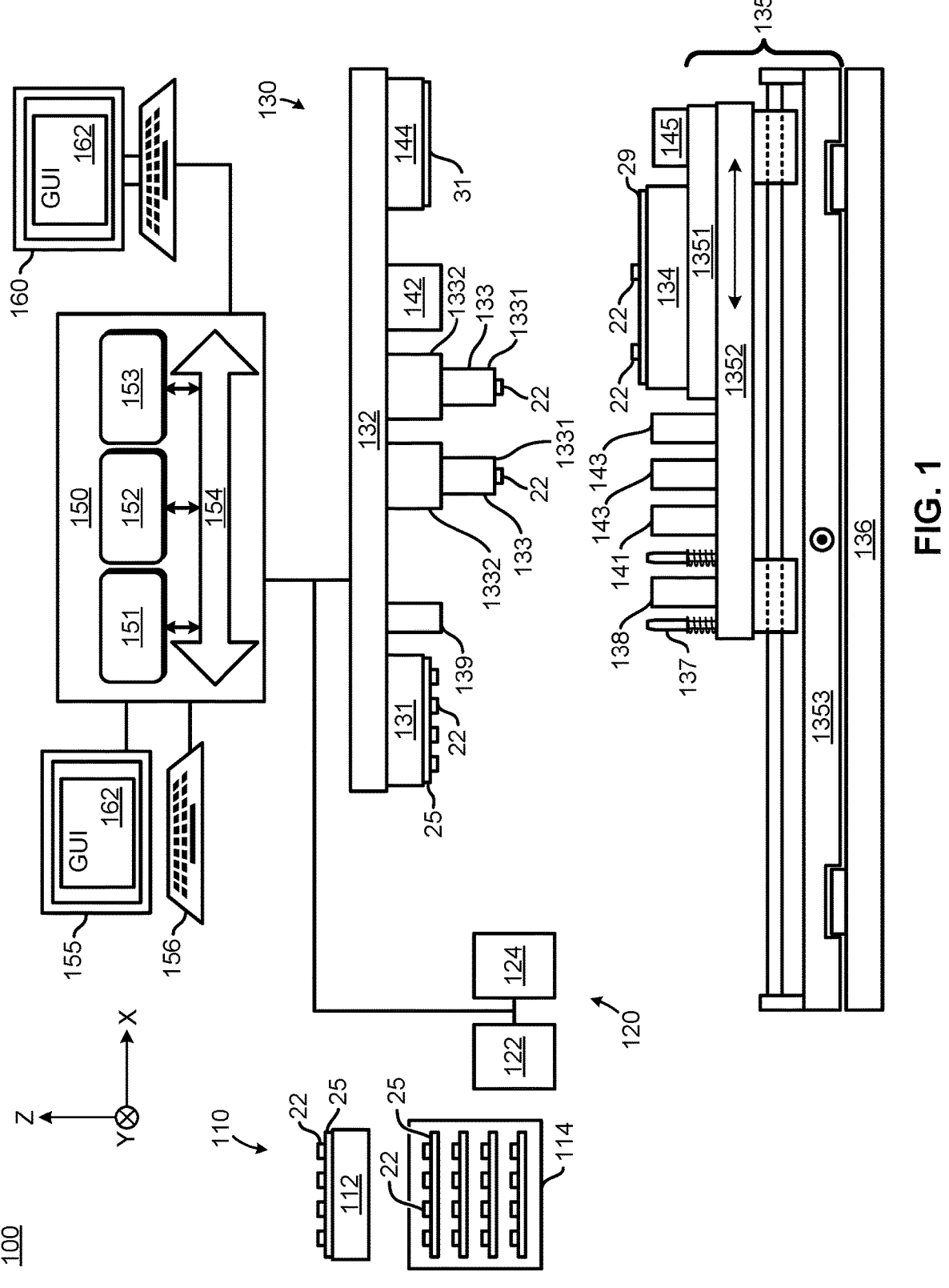
FIG. 1 is an illustration of an example embodiment of a bonding system that is adapted to bond a chiplet to a substrate.

The following paragraphs describe certain explanatory embodiments. Other embodiments may include alternatives, equivalents, and modifications. Additionally, the explanatory embodiments may include several novel features, and a particular feature may not be essential to some embodiments of the devices, systems, and methods that are described herein. Furthermore, some embodiments include features from two or more of the following explanatory embodiments. Thus, features from various embodiments may be combined and substituted as appropriate.

Also, as used herein, the conjunction "or" generally refers to an inclusive "or," although "or" may refer to an exclusive "or" if expressly indicated or if the context indicates that the "or" must be an exclusive "or."

Moreover, as used herein, the terms "first," "second," "third," and so on, do not necessarily denote any ordinal, sequential, or priority relation and may be used to more clearly distinguish one member, operation, element, group, collection, set, region, section, etc. from another without expressing any ordinal, sequential, or priority relation. Thus, a first member, operation, element, group, collection, set, region, section, etc. discussed below could be termed a second member, operation, element, group, collection, set, region, section, etc. without departing from the teachings herein.

And in the following description and in the drawings, like reference numbers designate identical or corresponding members throughout the several views.

FIG. 1 is an illustration of an example embodiment of a bonding system 100 that is adapted to bond a chiplet to a substrate. As shown in FIG. 1, the bonding system 100 includes a chiplet-source section 110, a transfer-and-activation section 120, and a chiplet-bonding section 130. The chiplet-source section 110 is the portion of the overall bonding system 100 that stores or provides the source chiplets 22 that will be used in the bonding process. The transfer-and-activation section 120 activates the source chiplets 22 such that the source chiplets 22 are ready for bonding, and the transfer-and-activation section 120 transfers the source chiplets 22 from the chiplet-source section 110 to the chiplet-bonding section 130. In some embodiments, one or both of the chiplet-source section 110 and the transfer-and-activation section 120 is a respective separate apparatus.

Additionally, in some embodiments, the transfer-and-activation section 120 activates the source chiplets 22 prior to the source chiplets 22 being placed in the chiplet-source section 110. The chiplet-bonding section 130 receives chiplets 22 that the transfer-and-activation section 120 supplies from the chiplet-source section 110, and then the chiplet-bonding section 130 bonds the chiplets 22 to a product substrate 29. The product substrate 29 may include chiplets 22 that are layered on top of each other. And, in the following description, the bonding of a chiplet 22 to the product substrate 29 may include the bonding of the chiplet 22 to another chiplet that was previously bonded to the product substrate 29.

As used herein, a chiplet 22 is an integrated circuit, also referred to as a microchip, a computer chip, etc. Also, a chiplet 22 is a component that includes a chiplet set of interconnect contacts. A chiplet 22 may be defined as a small block of semiconducting material on which a given functional circuit is fabricated. In the context of a substrate (e.g., wafer) that has been divided into individual chiplets 22, each chiplet 22 can be referred to as a die. A chiplet 22 will typically carry a set of integrated electronic components and circuits formed on it by patterning, coating, etching, doping, plating, singulating, etc. A chiplet 22 will typically have electrical functions, such as the following: memory, logic, field-programmable gate arrays (FPGA), accelerator circuits, application-specific integrated circuits (ASICs), security co-processors, graphics-processing units (GPUs), machine-learning circuits, specialized processors, controllers, devices, electrical circuits, arrays of passive components, etc. A chiplet 22 may also be or include a micro-electromechanical systems (MEMS) device, an optical device, an electrical-optical device, a microfluidic device, a piezoelectric device, a thermoelectric device, a spintronic device, a superconducting device, etc.

In some embodiments, a chiplet 22 has a small geometric shape (for example a rectangle or other polygon), and a chiplet 22 may have a planar dimension that is between 0.5 mm to 30 mm and may have a thickness of less than 1 mm (for example 0.8 to 0.01 mm). For example, a chiplet 22 may have widths and heights on the order of 0.5 mm to 15 mm and a thickness between 10-800 µm. A chiplet 22 may have been singulated from a larger substrate, such as a semiconductor wafer, which may have been subjected to a thinning process.

The chiplet-source section 110 includes one or more sources of chiplets. In FIG. 1, the chiplet-source section 110 includes a source substrate 25 and a source chuck 112, which can hold the source substrate 25. A plurality of chiplets 22 are temporarily attached to the source substrate 25. In some embodiments, the source substrate 25 is a tape frame, and the source chuck 112 is adapted to mount a tape frame and help with the release of a chiplet 22 from the tape frame. In some embodiments, the source substrate 25 is a reel on which one or more chiplets 22 are mounted, and the source chuck 112 is a reel feeder. In some embodiments, the source substrate 25 is a tray with pockets for holding a chiplet 22 in each pocket, and the source chuck 112 is a tray holder. And, in some embodiments, the chiplet-source section 110 includes a front opening unified pod ("FOUP") 114. The FOUP 114 may include a plurality of source substrates 25 and chiplets 22. Other chiplet sources known in the art may be used in the chiplet-source section 110, such as trays, adhesive tape in a frame, adhesive layer on a stiff substrate, etc.

The transfer-and-activation section 120 includes a transfer robot 122 and an activation device 124. The transfer robot

122 is able to lift and carry a substrate (e.g., a source substrate 25) to a second substrate chuck 131 in the bonding section 130. As understood in the art, the transfer robot 122 generally includes a hand and a robot arm that provides the degrees of motion to lift, carry, and place a substrate from one location to another, such as from one substrate chuck to another or from a substrate-storage location to a substrate chuck. An example of a transfer robot 122 is commonly referred to as an equipment front end module (EFEM), which includes robots for transferring substrates of a variety of types between ultra clean storage containers, such as FOUPs. The transfer robot 122 may be any suitable device known in the art, for example robots such as the wafer handling robot RR756L15 provided by Rorze Corporation of Fukuyama-shi, Hiroshima-ken, Japan.

The activation device 124 prepares the chiplets 22 that are being transferred for hybrid bonding. Hybrid bonding is a chiplet-bonding technique in which electrically insulating (silicon dioxide) chiplet surfaces with recessed metallic pads (e.g., copper pads) are brought into contact with each other. The metallic pads are aligned with each other, while the electrically insulating surfaces are bonded to each other via direct contact. Then an annealing process is performed in which heat is applied to the bonded structure, which causes the metallic pads to expand more relative to the electrically insulating material and contact each other, thus forming electrical connections between a chiplet 22 and a product substrate 29 (e.g., between a chiplet 22 and a chiplet that was previously bonded to a product substrate 29). For example, in some embodiments, when a chiplet 22 is brought into contact with a product substrate 29, hydrogen bonds are formed between the chiplet 22 and the product substrate 29 (e.g., between the chiplet 22 and a chiplet that was previously bonded to the product substrate 29). The annealing then causes the metallic pads in the chiplet 22 and the product substrate 29 to expand and fuse into covalent bonds. In some example embodiments, the activation device 124 includes a fluid source that applies, for example, deionized water, and includes a plasma source that activates the surface of the chiplets 22 prior to the chiplets 22 being carried to the chiplet-bonding section 130 by the transfer robot 122. Due to the materials of the chiplets 22 (i.e., dielectrics), when an activated chiplet 22 is brought into contact with another chiplet 22 (which may have been bonded to a product substrate 29), a fusion bond will occur between the dielectric surfaces of the two chiplets 22.

The bonding section 130 includes a second substrate chuck 131, a bridge 132, one or more bonding heads 133, a third substrate chuck 134 (which may also be referred to as a product chuck 134), a substrate stage 135 (which may include a rotation stage 1351, an x-motion stage 1352, a y-motion stage 1353, and possibly other stages), a base 136, one or more transfer heads 137, an upward-facing alignment system 138, a downward-facing alignment system 139, an upward-facing microscope 141, a downward-facing microscope 142, one or more shape-measurement sensors 143, a reference-wafer chuck 144, and an alignment microscope 145.

The second substrate chuck 131 receives source substrates 25 from the transfer robot 122. The received source substrates 25 may have chiplets 22 that have been activated by the activation device 124. The second substrate chuck 131 is attached to the bridge 132. The second substrate chuck 130 may also be referred to herein as a transfer chuck 131.

The third substrate chuck 134 is adapted to hold a product substrate 29. The third substrate chuck 134 may be mounted to a substrate stage 135. The substrate stage 135 may provide a single axis or multiple axes (e.g., five axes, six axes) of motion control with millimeter to sub-millimeter accuracy over a limited range. The substrate stage 135 may be a highly accurate x-y-z-θ stage combined with a light inter-ferometry measurement system so that the absolute position can be repeatedly achieved with high accuracy. In some embodiments, the substrate stage 135 includes a substrate rotation stage 1351, a substrate x-motion stage 1352, a substrate y-motion stage 1353, and possibly other stages.

The bonding section 130 also includes a plurality of bonding heads 133 that are attached to the bridge 132. Each bonding head 133 can convey chiplets 22 from the one or more transfer heads 137 to a product substrate 29 that is held by the third substrate chuck 134. The bonding heads 133 may be used in parallel. And the bonding heads 133 are positioned opposite to the third substrate chuck 134. Each bonding head 133 includes a bonding-head chiplet chuck 1331, and each bonding head 133 may include a bonding-head chiplet stage 1332. The bonding-head chiplet chuck 1331 is adapted to hold a chiplet 22 in a stable, secure manner with position stability that is within 1 μm. The bonding-head chiplet chuck 1331 may be adapted to hold the back of a chiplet 22. In some embodiments, the bonding-head chiplet chuck 1331 is adapted to grip the edges of a chiplet 22. The bonding-head chiplet chuck 1331 may be, for example, a vacuum chuck, a latch-type chuck, an edge-gripping chuck, a pin-type chuck, a groove-type chuck, an electrostatic chuck, or an electromagnetic chuck.

The bonding-head chiplet stage 1332 is a motion stage for controlling the position of the bonding-head chiplet chuck 1331 relative to the bridge 132. The bonding-head chiplet stage 1332 provides motion control in one or more direc-tions, for example the z-axis direction, as well as other directions (e.g., one or more of the x-, y-, θ- (rotation), ψ- (tip), and φ- (tilt) axes directions). The bonding-head chiplet stage 1332 may include one or more actuators or stages, such as voice-coil motors, piezoelectric motors, linear motors, nut-and-screw motors, piezo-actuated stages, brush-less DC motor stages, and DC stepper motors. The posi-tioning accuracy of the bonding-head chiplet stage 1332 may be within 100 nm.

The bonding section 130 includes one or more transfer heads 137, and the bonding section 130 may include a plurality of transfer heads 137 that are used in parallel. A transfer head 137 is used to transfer chiplets 22 from a source substrate 25 that is held by the second substrate chuck 131 to the bonding heads 133. In some embodiments, the transfer head 137 includes a chiplet chuck that is a vacuum-type suction nozzle that can be moved in at least the direction towards the second substrate chuck 131 by one or more actuators. The tip of the suction nozzle may be smaller than the chiplet 22. In some embodiments, the transfer head 137 includes a chiplet chuck for holding the chiplet 22, for example a Bernoulli chuck, a vacuum chuck, a pin-type chuck, a groove-type chuck, an electrostatic chuck, an electromagnetic chuck, a non-contact chuck, a PEEK plastic chuck, a suction cup, an edge-gripping chuck, and the like. The transfer head 137 may include one or more actuators or stages, such as voice-coil motors, piezoelectric motors, linear motors, nut-and-screw motors, piezo-actuated stages, brushless DC motor stages, and DC motor stages stepper motors, that are configured to move the chiplet chuck to and from the source substrate 25 and the bonding head 133, for example in the z-axis direction, as well as other directions (e.g., one or more of the x-, y-, θ-, ω-, and φ-axes direc-tions).

The bonding system 100 may include or be in commu-nication with a chiplet pretreatment system (not shown). The pretreatment that is performed by the pretreatment system may include wet or dry chemical processes that prepare the surface of a chiplet 22 prior to bonding the chiplet 22 to the product substrate 29. The pretreatment of the chiplet 22 may occur at any time prior to bonding the chiplet 22 to the product substrate 29. For example, the pretreatment may occur prior to the chiplet 22 being loaded onto the product substrate 29. Also for example, the pretreatment may occur while the chiplet 22 is on the source substrate 25, the pretreatment may occur while the chiplet 22 is on the transfer head 137, or the pretreatment may occur while the chiplet 22 is on the bonding head 133.

The chiplet-bonding section 130 includes an upward-facing alignment system 138. The upward-facing alignment system 138 may be used to measure the position of the chiplet 22 on the bonding head 133. The chiplet-bonding section 130 also includes a downward-facing alignment system 139 that is used to measure a bonding site on the product substrate 29. In some embodiments, the upward-facing alignment system 138 and the downward-facing alignment system 139 are members of a single system that can measure both the chiplet 22 on the bonding head 133 and the bonding site on the product substrate 29.

The chiplet-bonding section 130 may include at least one upward-facing microscope 141 for inspecting chiplets 22 on the source substrate 25 that is held by the second substrate chuck 131 and also inspecting chiplets on the bonding heads 133. The bonding system 100 may include at least one downward-facing microscope 142 for inspecting the product substrate 29.

The product substrate 29 includes a substrate set of interconnect contacts, and each chiplet 22 includes a chiplet set of interconnect contacts. The substrate set of interconnect contacts may be included in a chiplet 22 that was previously bonded to the product substrate 29. The chiplet set of interconnect contacts and the substrate set of interconnect contacts will in general be referred to as interconnect con-tacts, which provide a plurality of connections between a chiplet 22 and a product substrate 29. In some embodiments, these plurality of interconnect contacts provide electrical connections between a chiplet 22 and the product substrate 29. In some embodiments, the plurality of interconnect contacts provide one or more of fluid connections, optical connections, and electrical connections. During the bonding process it is very important that the chiplet set of intercon-nect contacts and the substrate set of interconnect contacts are aligned with each other. This becomes increasing diffi-cult as the size of each interconnect contact decreases and the density of the plurality of interconnect contacts increases. Each interconnect contact may be made of an electrically conductive material, such as copper. An inter-connect contact may be flush with the surface of the chiplet 22 or the product substrate 29, and an interconnect contact may be dished nanometers below the surface of the chiplet 22 or the product substrate 29. The surface of the chiplet 22 or the product substrate 29 may be a dielectric material, such as silicon oxide or silicon nitride, with interconnect contacts dished nanometers below the plane of the dielectric.

In some embodiments, the product substrate 29 is a patterned semiconductor wafer that has a substrate set of interconnect contacts. The substrate set of interconnect contacts may provide connections to components within the product substrate 29 or mounted onto the product substrate 29. The product substrate 29 may have a plurality of bonding sites for a chiplet 22 and also for other chiplets different from the chiplet 22. Chiplets 22 that are identical to or different from the chiplet 22 may already be bonded to the product substrate 29. As noted above, the substrate set of interconnect contacts may be on a chiplet 22 that is bonded to the product substrate 29. In some embodiments, the product substrate 29 is not a patterned semiconductor wafer but does have a substrate set of interconnect contacts.

The one or more shape-measurement sensors 143 can measure the relative height of a chiplet 22 (a chiplet 22 that is on a source substrate 25 that is held by the transfer chuck 131) to the source substrate 25 or to a reference plane at multiple locations across the chiplet 22 (or the relative height of a chiplet 22 on a bonding head 133 to the bonding head 133). Thus, the one or more shape-measurement sensors 143 can obtain shape measurements that indicate the flatness, or the non-flatness variations (the non-planarity or deviations from planarity), of the surface of a chiplet 22. Accordingly, shape measurements can indicate a surface topography (surface relief) of a chiplet 22, and the surface topography indicates the non-flatness variations of the surface of the chiplet 22.

Figures 2A, 2B, 2C, 2D:
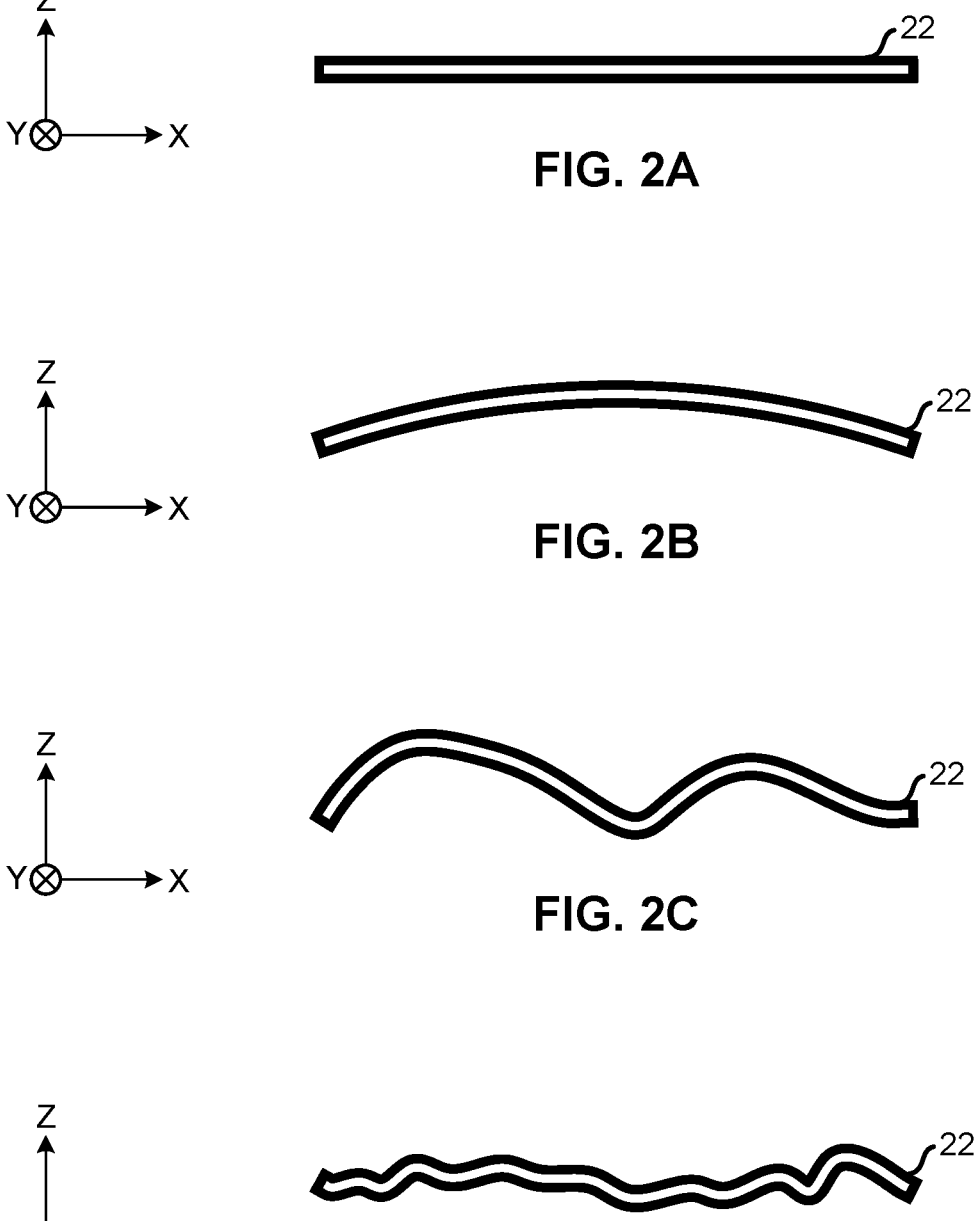
FIGS. 2A-D illustrate example embodiments of surface profiles of chiplets.

For example, FIGS. 2A-D illustrate example embodiments of surface profiles of chiplets. The chiplet 22 in FIG. 2A is flat. However, especially in a freestanding state, chiplets 22 can have significant curvature, which can depend upon their thicknesses and the variety of stresses in each of the layers within the chiplets 22. Generally, thinner chiplets 22 are more flexible and have greater curvature (e.g., due to their lower flexural rigidity compared to thicker chiplets 22). The chiplet 22 in FIG. 2B, which has non-flatness variations, has a uniform spherical curvature.

The chiplets 22 in FIGS. 2C and 2D have non-flatness variations (e.g., curvatures) that vary across the x axis. And the non-flatness variations of some chiplets 22 vary across the x-y plane.

Examples of shape-measurement sensors 143 include displacement-measurement sensors, such as optical sensors, air-gauge sensors, interferometric sensors, capacitive sensors, and spectral-interference sensors; two-dimensional (2D) digital-image correlation (DIC) apparatuses; three-dimensional (3D) digital-image correlation (DIC) apparatuses; white-light-interferometry apparatuses; and confocal-microscopy apparatuses.

The reference-wafer chuck 144 can hold a reference wafer 31. The reference wafer 31 provides a point of reference (a reference surface, such as a reference plane) for determining the flatness (non-flatness variations) or alignment of a chiplet 22 that is held by a bonding head 133. Chiplets 22 that are held by the bonding heads 133 are compared to the reference wafer 31 (e.g., to reference chiplets 33 that are on the reference wafer 31) to determine their respective non-flatness-variations or alignments. Chiplets that are used as reference chiplets 33 may have non-flatness variations that are within a threshold (e.g., may be as close to flat as possible according to the equipment and processes used to produce them).

The alignment microscope 145 (or the upward-facing microscope 141) captures images of the reference wafer 31 (e.g., images of regions on the reference wafer) and images of chiplets 22 that are held by one of the bonding heads 133 (e.g., images of regions on the chiplets 22). Also, the alignment microscope 145 may be registered to the reference-wafer chuck 144 (and to the reference wafer 31 via the reference-wafer chuck 144) and to the bonding heads 133 (and to test chiplets 22 via the bonding heads 133—a test chiplet 22 is a chiplet 22 that is held by a member of the bonding section 130). For example, the alignment microscope 145 may capture an image of a region of a reference chiplet 33 and an image of the corresponding region of a chiplet 22 that is held by a bonding head 133. Corresponding regions of chiplets are located at the same locations (e.g., coordinates), as measured from their edges or centers. And these regions may include one or more distinct or unique patterns, marks, features, or edges, which may make the regions easier to identify. If a reference chiplet 33 and a chiplet 22 are identical and completely aligned, then the corresponding regions would be identical, and consequently the images of the regions would be identical. However, if they are not identical or not completely aligned, then the images of the regions would not be identical.

Figure 3:
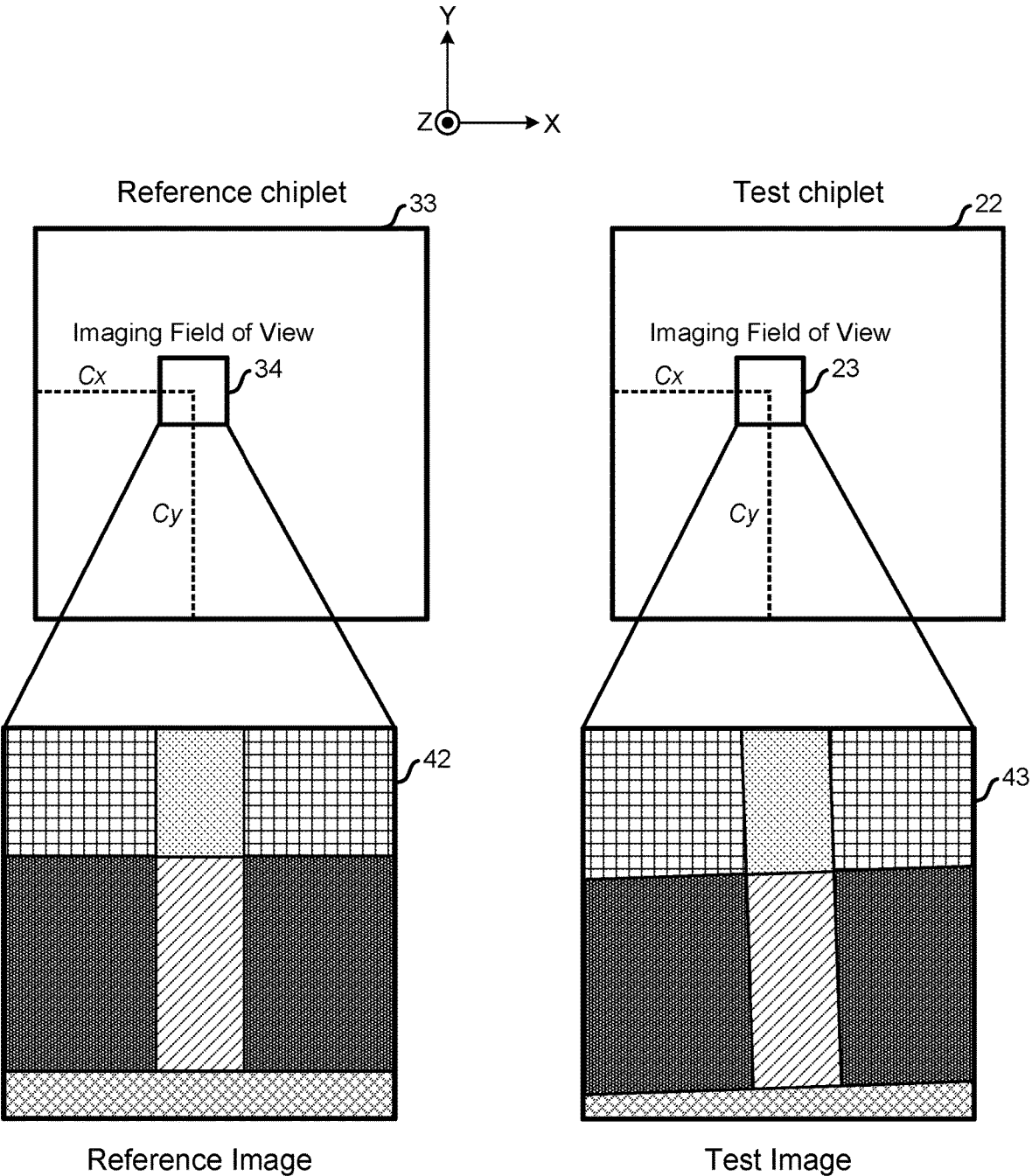
FIG. 3 illustrates examples of images of chiplets that were captured by an alignment microscope.

For example, FIG. 3 illustrates examples of images of chiplets that were captured by an alignment microscope 145 or an upward-facing microscope 141. A reference image 42 is an image of a reference region 34 of a reference chiplet 33 on a reference wafer 31, and a test image 43 is an image of a corresponding test region 23 of a test chiplet 22 (which is a chiplet 22 that is held by a member of the bonding section 130). The alignment microscope 145 is registered to the reference chiplet 33, and the field of view of the reference image 42 (the imaging field of view) is centered at the x,y coordinates Cx, Cy in this example. Accordingly, the bonding system 100 can use the reference image 42 as an alignment template. Also for example, if the width of the reference chiplet 33 is 10 mm, the width of the imaging field of view may be 500 μm. Thus, the reference region 34 of the reference chiplet 33 in the reference image 42 would be 500 μm wide. The field of view of the test image 43 is also centered at Cx, Cy. If the reference chiplet 33 and the test chiplet 22 are identical and aligned, and consequently the reference region 34 and the corresponding test region 23 are identical and aligned, then the reference image 42 and the test image 43 will be identical.

However, in this example, the test chiplet 22 is rotated relative to the reference chiplet 33. Thus, the test image 43 is not identical to the reference image 42, the reference region 34 and the corresponding test region 23 are not aligned, and the structures (e.g., copper pads) on the test chiplet 22 are rotated relative to the structures on the reference chiplet 33.

Also, the bonding system 100 (e.g., the control device 150) maps (e.g., calibrates, registers) the components, subsystems, motions, metrology, etc., of the bonding system 100 to a global (world of one or both of the bridge 132 and base 136) coordinate system. A test chiplet 22 that is aligned to a reference chiplet 33 may not be physically superposed with the reference chiplet 33. Instead, the test chiplet 22 may be positioned such that the bonding-head chiplet chuck 1331 holds the test chiplet 22 in the same positional relationship with one or more upward-facing microscopes 141, one or more shape-measurement sensors 143, or an alignment microscope 145 as the reference chiplet 33 on the reference wafer 31, as indicated by the position of the reference-wafer chuck 144.

The bonding system 100 also includes one or more processors 151 and one or more computer-readable storage media 152. The one or more processors 151 and the one or more computer-readable storage media 152 may be components of a control device 150. The bonding system 100 is regulated, controlled, or directed by the one or more processors 151 in communication with one or more components or subsystems of the bonding system 100, such as the source chuck 112, the transfer robot 122, the activation device 124, the second substrate chuck 131, the third substrate chuck 134, the substrate stage 135, the transfer head 137, the bonding heads 133, the upward-facing alignment system 138, the downward-facing alignment system 139, the upward-facing microscope 141, the downward-facing microscope 142, the shape-measurement sensors 143, the reference-wafer chuck 144, and the alignment microscope 145.

The one or more processors 151 are or include one or more central processing units (CPUs), such as microprocessors (e.g., a single core microprocessor, a multi-core microprocessor); one or more graphics processing units (GPUs); one or more application-specific integrated circuits (ASICs); one or more field-programmable-gate arrays (FPGAs); one or more digital signal processors (DSPs); or other electronic circuitry (e.g., other integrated circuits). Furthermore, a processor 151 may be a purpose-built controller or may be a general-purpose controller. The one or more processors 151 may include a plurality of processors that include processors that are both (i) included in the control device 150 and (ii) in communication with the bonding system 100 but not included in the control device 150. And the one or more processors 151 are an example of a processing unit.

The one or more processors 151 may operate based on computer-readable instructions in one or more programs stored on one or more computer-readable storage media 152. As used herein, a computer-readable storage medium 152 is a computer-readable medium that includes an article of manufacture, for example a magnetic disk (e.g., a floppy disk, a hard disk), an optical disc (e.g., a CD, a DVD, a Blu-ray), a magneto-optical disk, magnetic tape, and semiconductor memory (e.g., a non-volatile memory card, flash memory, a solid-state drive, SRAM, DRAM, EPROM, EEPROM). And examples of the one or more computer-readable storage media 152 include networked-attached storage (NAS) devices, intranet-connected storage devices, and internet-connected storage devices. The one or more computer-readable storage media 152, which may include both ROM and RAM, can store computer-readable data or computer-executable instructions. Furthermore, in embodiments where the one or more computer-readable storage media 152 include RAM, the one or more processors 151 can use the RAM as a work area. Additionally, when the control device 150 or the one or more processors 151 are described as obtaining information or data, recording information or data, generating information or data, storing information or data, operating on information or data, processing information or data, etc., the information or data are stored in the one or more computer-readable storage media 152. Also, the one or more computer-readable storage media 152 are an example of a storage unit. And the non-transitory computer-readable storage media 152 may be distributed among multiple processors 151.

The control device 150 also includes I/O components 153. The I/O components 153 include physical interfaces and communication components (e.g., a GPU, a network-interface controller) that enable communication (wired or wireless) with other members of the bonding system 100 (e.g., the source chuck 112, the transfer robot 122, the activation device 124, the second substrate chuck 131, the third substrate chuck 134, the substrate stage 135, the transfer head 137, the bonding heads 133, the upward-facing alignment system 138, the downward-facing alignment system 139, the upward-facing microscope 141, the downward-facing microscope 142, the shape-measurement sensors 143, the reference-wafer chuck 144, and the alignment microscope 145), with other computing devices (e.g., a networked computer 160), and with input or output devices, which may include a display device 155, a network device, a keyboard 156, a mouse, a printing device, a light pen, an optical-storage device, a scanner, a microphone, a drive, a joystick, and a control pad.

Also, the hardware components of the control device 150 communicate via one or more buses 154 or other electrical connections. Examples of buses 154 include a universal serial bus (USB), an IEEE 1394 bus, a PCI bus, an Accelerated Graphics Port (AGP) bus, a Serial AT Attachment (SATA) bus, and a Small Computer System Interface (SCSI) bus.

The networked computer 160 may perform analysis and may provide information, such as information concerning substrates and chiplets. In some embodiments, there are one or more graphical user interfaces (GUIs) 162 on one or both of the networked computer 160 and a display device 155 in direct communication with the control device 151 that are presented to an operator or user.

Figure 4:
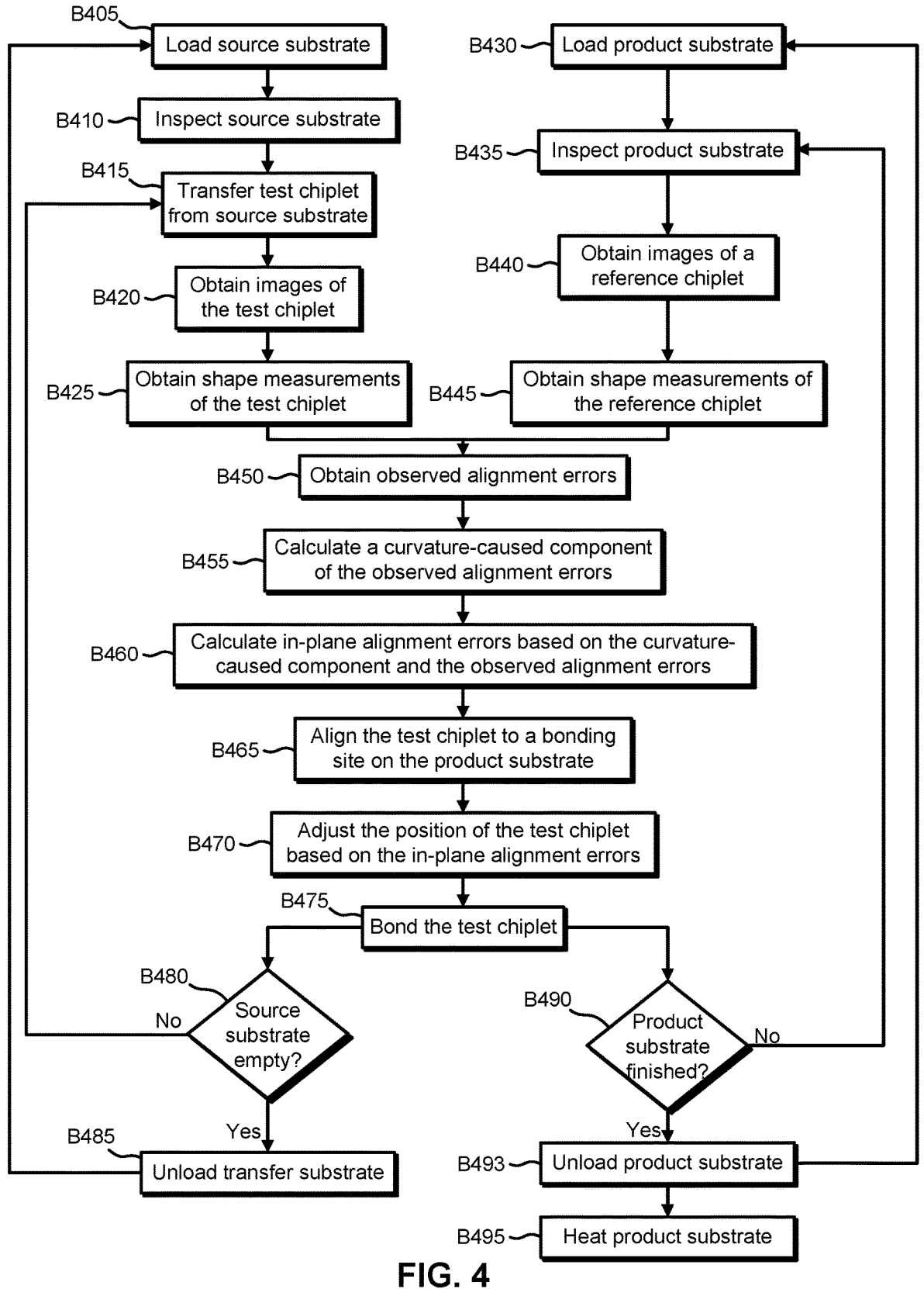
FIG. 4 illustrates an example embodiment of an operational flow for bonding a chiplet to a substrate.

FIG. 4 illustrates an example embodiment of an operational flow for bonding a chiplet to a substrate. Although this operational flow and the other operational flows that are described herein are each presented in a certain respective order, some embodiments of these operational flows perform at least some of the operations in different orders than the presented orders. Examples of different orders include concurrent, parallel, overlapping, reordered, simultaneous, incremental, and interleaved orders. Also, some embodiments of these operational flows include operations (e.g., blocks) from more than one of the operational flows that are described herein. Thus, some embodiments of the operational flows may omit blocks, add blocks (e.g., include blocks from other operational flows that are described herein), change the order of the blocks, combine blocks, or divide blocks into more blocks relative to the example embodiments of the operational flows that are described herein.

This operational flow and the other operational flows that are described herein are performed by a bonding system 100, and one or more control devices 150 can control the bonding system 100 to perform the operations that are described in the operational flows.

In FIG. 4, a first flow starts in block B405, and a second flow starts in block B430.

In block B405, a bonding system 100 loads a source substrate 25 onto a transfer chuck 131. The loading in block B405, as well as in block B430, may be performed by one or more robots. Examples of the one or more robots include wafer-handling robots, chiplet-feeding systems, and tray handlers.

Next, in block B410, the bonding system 100 inspects the source substrate 25 that was loaded onto the transfer chuck 131. The inspection may include obtaining images of the source substrate 25 using an upward-facing microscope 141. The control device 150 can analyze those images to identify the positions of test chiplets 22 (which are source chiplets that are held by a member of the bonding section 130) on the source substrate 25.

The first flow then proceeds to block B415, where one or more transfer heads 137 transfer test chiplets 22 from the source substrate 25 to one or more bonding heads 133. The transfers may be performed with an accuracy that is within the range of a bonding head chiplet stage 1332. In some embodiments, the one or more bonding heads 133 retrieve one or more test chiplets 22 directly from the source substrate 25. The approximate position of a test chiplet 22 on a bonding head 133 may be measured using the upward-facing microscope 141. The upward-facing microscope 141 may be a high numerical aperture (NA) microscope that is able to resolve marks or interconnect contacts around 3 μm at the corners of the test chiplet 22.

Figure 5A:
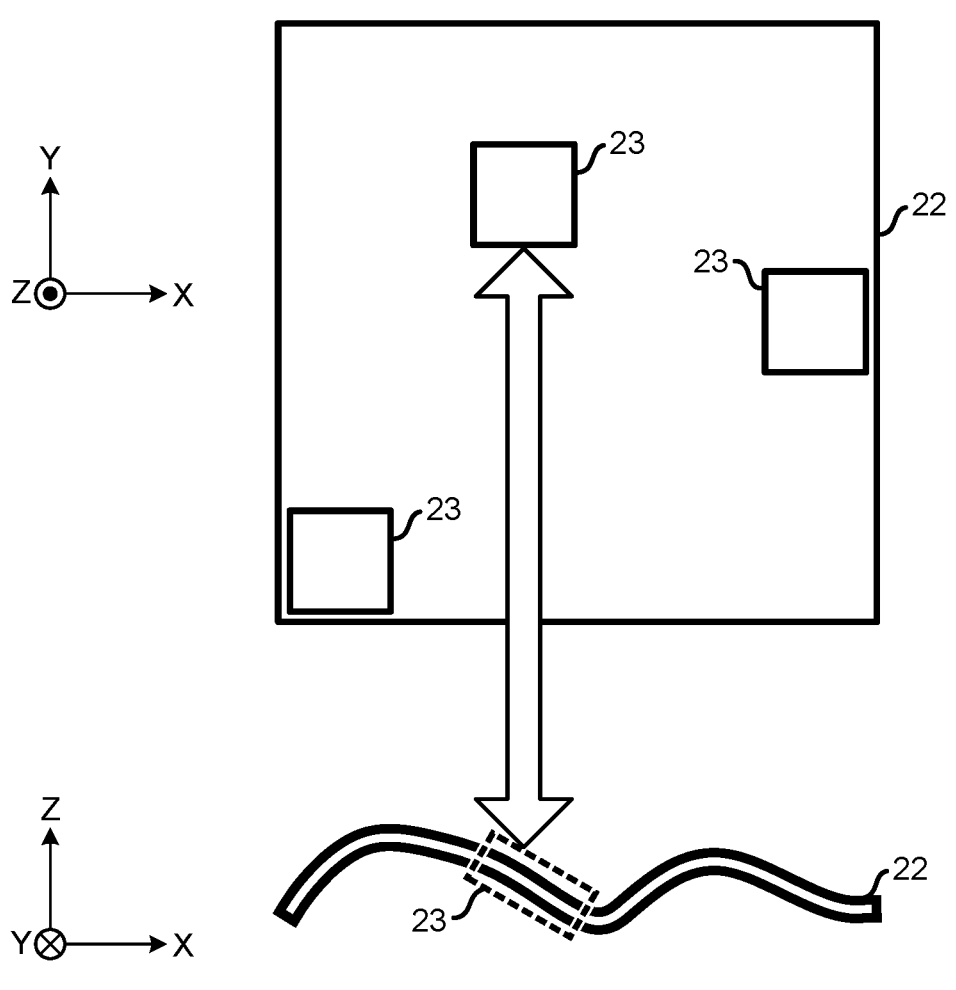
FIGS. 5A-B illustrate an example embodiment of a test region on a test chiplet.
Figure 5B:
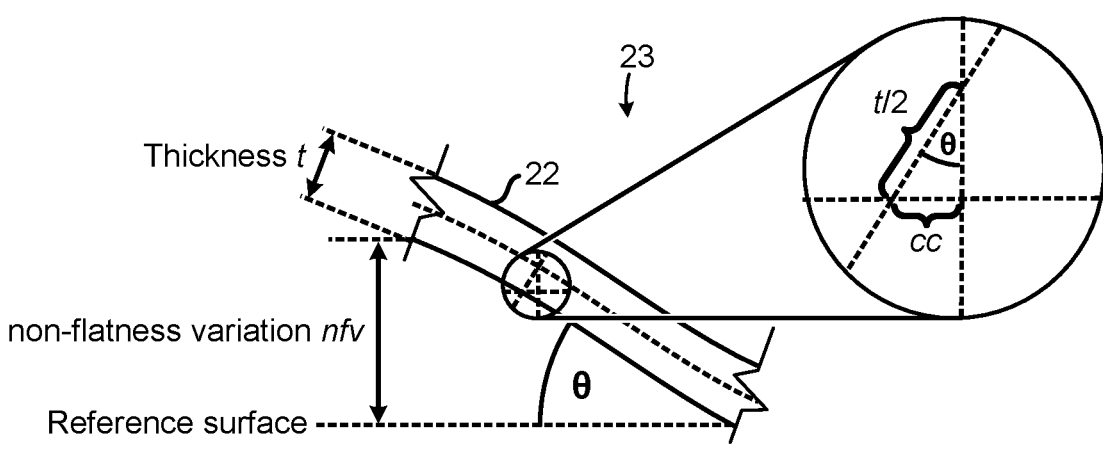

Then, in block B420, an alignment microscope 145 captures one or more test images of the test chiplet 22. The one or more test images may be images of respective test regions 23 on the test chiplet 22, and the test regions 23 correspond to respective reference regions 34 on a reference chiplet 33. For example, FIGS. 5A-B illustrate an example embodiment of test regions 23 on a test chiplet 22. FIG. 5A illustrates both the view along the z axis and the view along the y axis, which shows the profile of the surface (which shows the surface topography) of the test chiplet 22. FIG. 5B shows an enlarged view of one test region 23. The test chiplet 22 is not flat, and thus the test chiplet 22 has non-flatness variations (a surface topography) that include various curves or undulations. Also, the test region in FIG. 5B has a non-flatness variation.

Next in block B425, one or more shape-measurement sensors 143 obtain shape measurements of the surface of the test chiplet 22. For example, the one or more shape-measurement sensors 143 may obtain respective shape measurements of each test region 23 on the test chiplet 22. The shape measurements indicate the non-flatness variations (the surface topographies) of the surfaces of the test regions 23, and accordingly the surface measurements indicate any deviations from planarity in the test regions 23. For example, the shape measurements may include respective 3D coordinates for a plurality of locations on the surface of a test region 23.

The first flow then joins the second flow in block B450.

The second flow starts in block B430, where the bonding system 100 loads a product substrate 29 onto a product chuck 134. The loading may include standard lithography alignment techniques that use alignment marks, such as moiré interference marks, two-dimensional diffraction gratings, crosses, box-in-boxes, bar-in-bars, bullseyes, edge marks, serpentine marks, arrays of interconnect contacts, etc.

Then, in block B435, the bonding system 100 inspects the product substrate 29 that was loaded onto the product chuck 134. The inspection may include obtaining images of the product-substrate 29 using a downward-facing microscope 142. The control device 150 can analyze those images to inspect the product substrate 29 and identify one or more bonding sites on the product substrate 29.

The second flow then advances to block B440, where the alignment microscope 145 captures one or more reference images 42 of a reference chiplet 33 to which the test chiplet 22 has been aligned. For example, the alignment microscope 145 may capture respective reference images 42 of one or more reference regions 34 on the reference chiplet 33. The one or more reference regions 34 may include some unique or distinct features that make the one or more reference regions 34 easy to identify.

Next, in block B445, the one or more shape-measurement sensors 143 obtain shape measurements of the surface of the reference chiplet 33. For example, the one or more shape-measurement sensors 143 may obtain respective shape measurements of each reference region 34 on the reference chiplet 33. Also, for example, the shape measurements may include respective 3D coordinates for a plurality of locations on the surface of a reference region 34. Then the second flow moves to block B450, where the second flow joins the first flow.

In block B450, the bonding system 100 obtains observed alignment errors (measured alignment errors), which are alignment differences between the test chiplet 22 and the reference chiplet 33 (e.g., between a reference region 34 on the reference chiplet 33 and a test region 23 on the test chiplet 22). Later in the flow in FIG. 4, the bonding system 100 performs a position adjustment based on the observed alignment errors. The position adjustment compensates for (e.g., removes) alignment errors, and the position adjustment includes the one or more processors 151 sending instructions to move to one or more bonding-head chiplet stages 1332 or to a substrate stage 135. To obtain observed alignment errors, the one or more processors may perform digital image correlation (DIC). For example, some embodiments of digital image correlation can be described by the following:

$$G_a = \mathcal{F}\{g_a\}, \ G_b = \mathcal{F}\{g_b\}, \tag{1}$$

$$R = \frac{G_a \circ G_b^*}{|G_a \circ G_b^*|}, \tag{2}$$

$$R_{jk} = \frac{G_{a,jk} \cdot G_{b,jk}^*}{\left|G_{a,jk} \cdot C_{b,jk}^*\right|}, \tag{3}$$

$$r = \mathcal{F}^{-1}\{R\}, \text{ and} \tag{4}$$

$$(\Delta x, \Delta y) = \operatorname*{argmax}_{(x,y)}\{r\}, \tag{5}$$

where $g_a$ is the reference image 42 of the reference region 34; where $g_b$ is the test image 43 of the test region 23; where $G_a$ is the 2D Fourier transform of the reference image 42; where $G_b$ is the 2D Fourier transform of the test image 43; where R is the Fourier transform of the correlogram, which is obtained by obtaining the element by element normalized Hadamard product of $G_a$ and the complex conjugate $G_b^*$; where each element $R_{jk}$ of R is the normalized product of each element of $G_{a,jk}$ and the complex conjugate $G_{b,jk}^*$; where r is the cross-correlation and is calculated by performing an inverse Fourier transform of R; and where ($\Delta x$, $\Delta y$) are the integer shifts. $\Delta x$ and $\Delta y$ are the x-y coordinates at which the maximum value of r is found by finding the location in x and y of the maximum value of r. And the result of the digital image correlation may be a correlation image that indicates the observed alignment errors.

Observed alignment errors $err_{ob}$ may all appear to be in-plane alignment errors (translations, in-plane rotations). But observed alignment errors $err_{ob}$ may include both a component (an "in-plane-error component $err_{ip}$") that is caused by in-plane alignment errors and a component (a "curvature-caused component cc") that is caused by a curvature (an out-of-plane variation) of a chiplet 22. Thus, observed alignment errors $err_{ob}$ can be the combination of an in-plane-error component $err_{ip}$ and a curvature-caused component cc ($err_{ob}=err_{ip}+cc$). Furthermore, although the curvature-caused component cc appears to be an in-plane alignment error in the observed alignment errors $err_{ob}$, the curvature-caused component cc may not actually be caused by an alignment error, including an in-plane alignment error. As chiplets 22 are pressed against the product substrate 29, any non-flatness variations in the chiplet 22 are flattened (reduced or eliminated), and thus any in-plane alignment errors that appear to exist because of the curvature-caused component cc are reduced or eliminated.

Consequently, the curvature-caused component cc can introduce an alignment metrology error because, although the curvature-caused component cc may not actually indicate an alignment error (because the curvature-caused component cc will be reduced or eliminated as the chiplet 22 is pressed against the product substrate 29), the curvature-caused component cc may appear to be one or more in-plane alignment errors in the observed alignment errors $err_{ob}$. Thus, because the curvature-caused component cc may not actually indicate an in-plane alignment error, the curvature-caused component cc may introduce or act as an in-plane error in the alignment metrology and may also be referred to as an alignment metrology error.

As noted above, the non-flatness variations (e.g., curvature) may depend on a chiplet's thickness t, and thinner chiplets 22 tend to be more flexible and less rigid. For example, a chiplet that is 40 μm thick and that has a 5×5 to 6×6 mm size may have a 20 μm spherical curvature. In such circumstances, in an imaging field of view (FOV) of 500× 500 μm, the maximum shape variation would be approximately 4 μm over the field of view.

And, as noted above, the non-flatness variations of the chiplet 22 can cause a curvature-caused component cc to be included in observed alignment errors $err_{ob}$. For example, in some embodiments, the curvature-caused component cc that is caused by the non-flatness variations of a chiplet 22 can be described by the following:

$$cc = \frac{t_{av}}{2} * \sin\theta, \qquad (6)$$

where $t_{av}$ is the average thickness of the chiplet 22 in the imaging field of view and where θ is the slope of the surface of the chiplet 22. The slope θ is calculated relative to a reference surface, and in this embodiment the reference surface is the reference chiplet 33, although some embodiments use a plane as the reference surface. Thus, in some embodiments, the slope θ is calculated based on the shape measurements of the test chiplet 22 and on the shape measurements of the reference chiplet 33. For example, the shape measurements of the test chiplet 22 and the shape measurements of the reference chiplet 33 can be used to calculate the non-flatness variations nfv of the test chiplet 22, which can be used to calculate the slope θ.

Another source of the curvature-caused component cc can be variations in the thicknesses t of the chiplet 22 (chiplet thicknesses t). Thus, the chiplet thickness t may also be measured by a shape-measurement sensor 143 (e.g., in block B425). Typically, a laser displacement sensor or other similar sensors can monitor the distance $D_z$ to the surface of the bonding-head chiplet chuck 1331 (without a chiplet 22) in the z-axis direction and then measure the distance to the surface of a chiplet 22 that is on the bonding-head chiplet chuck 1331 ($D_z$+t+Δt) to obtain the chiplet thickness t (t+Δt=$D_z$+t+Δt−$D_z$). This assumes that the sensor has a sensing range of t+Δt. Spectral interference sensors, interferometers, capacitive sensors, or air gauges could be employed for this accurate chiplet-thickness measurement as well.

Moreover, a chiplet's non-flatness variations nfv may be introduced in both of the in-plane (x and y) directions, for example as described by the following:

$$\begin{bmatrix} cc_x \\ cc_y \end{bmatrix} = \frac{t}{2} * M(\theta_x, \theta_y), \qquad (7)$$

where M may be a linear matrix or a system of equations composed of the trigonometric geometry transformation terms dependent upon the non-flatness angles of the chiplet, $\theta_x$ and $\theta_y$, with respect to the orthogonal in-plane axis that is used to project a vector defined by the non-flatness angles onto the reference plane.

Figure 6A:
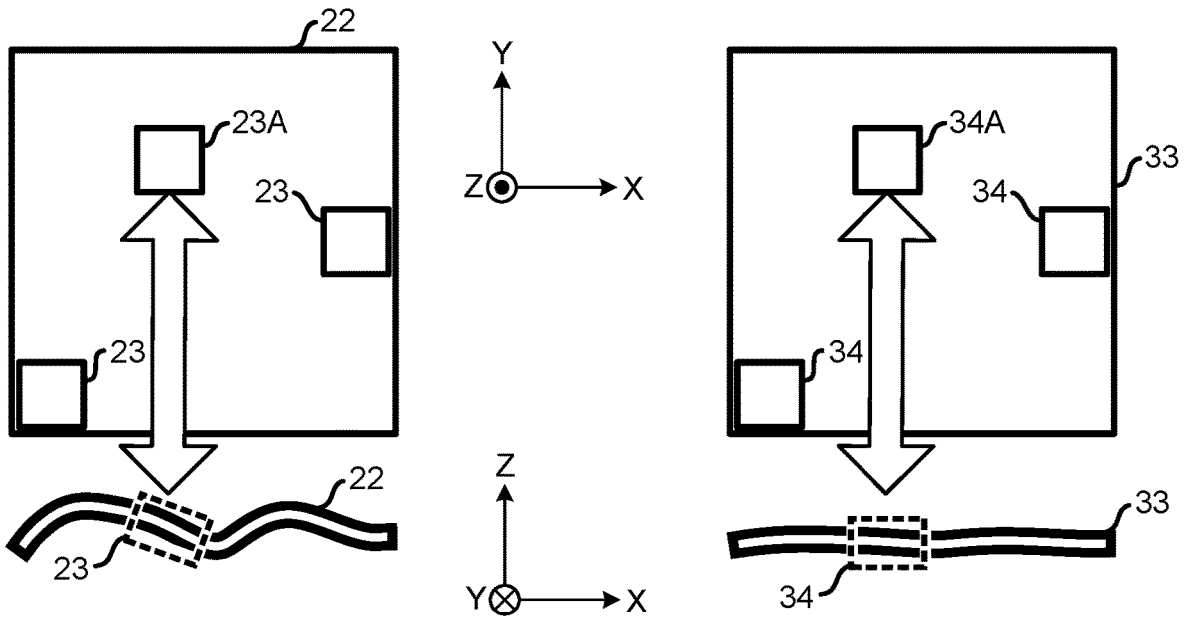
FIGS. 6A-B illustrate an example of surface profiles of a reference chiplet and a test chiplet.
Figure 6B:
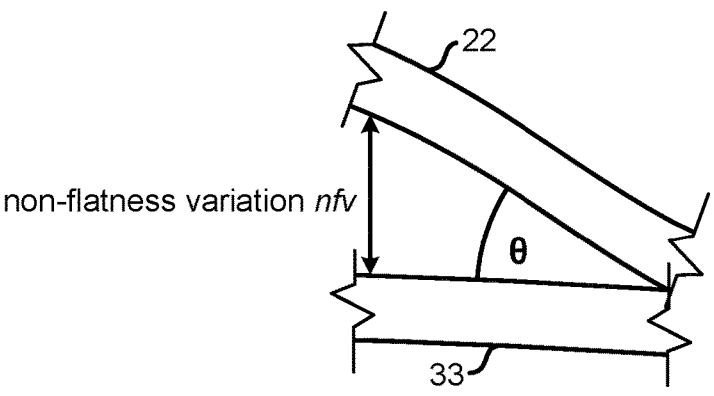

For example, FIGS. 6A-B illustrate an example of surface profiles of a reference chiplet and a test chiplet. FIG. 6A shows a test region 23A on a test chiplet 22 and the corresponding reference region 34A on a reference chiplet 33. Also, although both the test region 23A and the reference region 34A include non-flatness variations, the reference chiplet 33 in general, and the reference region 34A in particular, are flatter than the test chiplet 22 (and, in particular, flatter than the test region 23A). FIG. 6B illustrates the slope θ between the surface of the chiplet 22 in the test region 23A and the surface of the reference chiplet 33 in the corresponding reference region 34A.

Accordingly, the slope θ indicates the angle between the surface of the chiplet 22 and the corresponding surface of the reference chiplet 33. The slope θ may be the average slope of the chiplet 22 in the imaging field of view, the maximum slope of the chiplet 22 in the imaging field of view, the angle in each of the x-axis and y-axis directions of a plane that is fitted to the topography of the chiplet 22 in the field of view, or the angle in each of the x-axis and y-axis directions of a plane that is fitted to the edges of chiplet 22 in the imaging field of view.

For example, in an imaging field of view of 500×500 μm, where the maximum non-flatness variation nfv (the deviation from planarity) is 4 μm and the average thickness t is 100 μm, the curvature-caused component cc that is caused by the non-flatness variations could be calculated as 800 nm (100/2*4/250 μm). Furthermore, for example if the goal is bonding with an alignment error that is less than 50-100 nm, such a curvature-caused component cc will be a significant portion of the observed alignment errors $err_{ob}$ or potentially be orders of magnitude larger than the in-plane alignment errors, as shown in this example. Also, if the goal is an alignment metrology error that is less than 20 nm, such a curvature-caused component cc would prevent the goal from being accomplished. For example, in some embodiments, each of the metallic pads on the chiplets 22 and on the product substrate 29 has a radius that is 1 μm to 2 μm, and the goal is to align the metallic pads on the chiplets 22 and on the product substrate 29 with a 10 nm alignment accuracy.

To satisfy a goal of an alignment metrology error that is no more than 10 nm, the chiplets 22 could be flatter, for example have no more than a 50 nm non-flatness variation over the entire 500 μm imaging field of view using chiplets that are 100 μm thick. For thicker chiplets 22, such as chiplets 22 that are 300 μm thick, the chiplets 22 would need to be even flatter-such chiplets 22 would need to have no more than a 17 nm variation over the 500 μm imaging field of view. However, producing such flat chiplets 22 is challenging for both thick chiplets 22 and thin chiplets 22. Typically, after chucking the chiplets 22, the chiplets 22 may still have non-flatness variations of hundreds of nanometers to thousands of nanometers (microns) over the chiplet 22 or over the imaging field of view. For example, if there is a 1 μm non-flatness variation over a 500 μm imaging field of view, this could induce a 25 nm in-plane error in the alignment metrology. Furthermore, in some embodiments, many chiplets 22 are stacked on top of each other on a product substrate 29, and thus the chiplets 22 tend to be thinner.

Accordingly, in block B455, the bonding system 100 calculates a curvature-caused component cc of the observed alignment errors $err_{ob}$ based on the shape measurements of the test chiplet 22 and on the shape measurements of the reference chiplet 33. In some embodiments, at least part of the calculation of the curvature-caused component cc can be described by equation (6).

Next, in block B460, the bonding system 100 calculates in-plane alignment errors (chiplet-position errors), which are the in-plane-error component err$_{ip}$, based on the curvature-caused component cc and on the observed alignment errors err$_{ob}$. For example, the bonding system 100 may calculate the in-plane-error component err$_{ip}$ (the in-plane alignment errors) by subtracting the curvature-caused component cc from the observed alignment errors err$_{ob}$ (err$_{ip}$=err$_{ob}$–cc). Consequently, in blocks B455-B460, the bonding system 100 calculates in-plane alignment errors based on an image of a test region 23 on the chiplet 22 and on the deviation from planarity (the non-flatness variations) of the test region 23. Additionally, in-plane alignment errors (chiplet-position errors) are also adjusted alignment differences between the test chiplet 22 and the reference chiplet 33 (e.g., between a reference region 34 on the reference chiplet 33 and a test region 23 on the test chiplet 22).

The flow then proceeds to block B465, where the bonding system 100 aligns the test chiplet 22 with a bonding site on the product substrate 29. For example, the bridge 132 and the product chuck 134 (or the substrate stage 135) may have alignment marks, and these marks can be used to align the upward-facing microscope 141 and the alignment microscope 145 to the bridge 132 and to align the downward-facing microscope 142 to the product chuck 134 (or the substrate stage 135). Such aligning registers the upward-facing microscope 141, the alignment microscope 145, and the downward-facing microscope 142 to fixed frames of reference. Also, the product substrate 29 includes features or global alignment marks that can be identified from the images of the product substrate 29 that were obtained in block B435, and these features can be used to register the product substrate 29 in the global coordinate system and then register the reference chiplet 33 to the product substrate 29, for example such that structures (e.g., electrical pads, such as metallic pads, interconnect contacts) on the reference chiplet 33 are aligned to respective corresponding structures (e.g., electrical pads, such as metallic pads, interconnect contacts) on the product substrate 29. Additionally, the bonding heads 133 may be registered to the reference-wafer chuck 144, which enables the bonding system 100 to align test chiplets 22 that are held by the bonding head 133 to bonding sites on the product substrate 29 that have been aligned with a reference chiplet 33.

The flow then moves to block B470, where the bonding system 100 adjusts the position of the test chiplet 22 relative to the product substrate 29 based on the in-plane alignment errors (adjusted alignment differences). For example, in some embodiments, the adjusted position ap can be described by the following:

$$ap = g(err_{ip}),\qquad(8)$$

where g(x) is a correction or compensation function (e.g., a matrix).

The substrate stage 135 may include a stage-position encoder that allows accurate positioning of the product chuck 134 and the product substrate 29 relative to the bonding heads 133. Examples of stage-position encoders include the following: a laser optical interferometer position measurement system, an ultrasonic distance measurement system, a capacitive displacement measurement system, optical position encoders. And some embodiments use other methods of measuring the position of an object with sub-micron resolution. Each of the bonding bonding-head chiplet stages 1332 may include a bonding-head position encoder that is similar to the stage-position encoder.

Next, in block B475, the bonding system 100 bonds the test chiplet 22 with the product substrate 29. In block B475, the bonding head 133 that holds the test chiplet 22 is moved towards the product chuck 134. The bonding-head chiplet stage 1332 may include one or more actuators that can move the bonding-head chiplet chuck 1331 towards the product chuck 134 until the test chiplet 22 that is held by the respective bonding-head chiplet chuck 1331 touches a bonding site of the product substrate 29.

If the bonding system 100 is performing a hybrid-bonding method, then the bonding surfaces of the test chiplet 22, which bond with the product substrate 29, are activated prior to block B475. For example, the bonding surface of the test chiplet 22 may be activated while the test chiplet 22 is on the bonding heads 133, the bonding surface of the test chiplet 22 may be activated while the test chiplet 22 is on a transfer head 137, the bonding surface of the test chiplet 22 may be activated while the test chiplet 22 is on a source substrate 25 that is held by a transfer chuck 131, and the bonding surface of the test chiplet 22 may be activated prior to block B405. The bonding surface of the product substrate 29 may be activated while the product substrate 29 is held by the product chuck 134, and the bonding surface of the product substrate 29 may be activated prior to block B430. Activating the bonding surfaces may include rinsing the bonding surfaces with deionized water and exposing the bonding surfaces to a plasma. Other well known methods may be used for preparing the bonding surfaces so that dangling bonds are created on the bonding surfaces.

After block B475, the first flow then proceeds to block B480, where the bonding system 100 checks the source substrate 25 that is held by the transfer chuck 131 to determine if the source substrate 25 is empty (i.e., does not have any chiplets 22 that are to be bonded to the product substrate 29). This may include the one or more processors 151 checking information about the source substrate 25 in the non-transitory computer-readable storage media 152 to determine how many chiplets 22 that were to be bonded were on the source substrate 25 and how many have already been removed. If the source substrate 25 is not empty of chiplets 22 to be bonded (B480=No), then the first flow returns to block B415.

If the source substrate 25 is empty of chiplets 22 to be bonded (B480=Yes), then the first flow advances to block B485, where the one or more processors 151 send instructions for the source substrate 25 to be removed from the bonding system 100. Additionally, in some embodiments, the source substrate 25 (e.g., an array of chiplets on a source frame) may have more chiplets 22 than the number of bonding sites on the product substrate 29 (e.g., the source substrate 25 has enough chiplets 22 to supply chiplets 22 to two or more product substrates 29). For example, the source substrate 25 may have more chiplets 22 of Type 1 than the number of bonding sites for chiplets 22 of Type 1 on the product substrate 29. In this case, the bonding system 100 may unload the source substrate 25 even though it may not be fully empty of chiplets 22 and reload another source substrate 25 that has chiplets 22 of Type 2 that are to be bonded to the product substrate 29. The first flow then returns to block B405 unless there are no more chiplets 22 to be bonded, in which case the first and second flow end.

After block B475, the second flow moves to block B490, where the bonding system 100 checks the product substrate 29 to determine whether all the bonding sites, which may include bonding sites for different chiplet types, on the product substrate 29 are populated (have been bonded to a chiplet 22). This may include the one or more processor 151 checking information about the product substrate 29 in the non-transitory computer-readable storage media 152 to determine how many bonding sites (sites to be bonded) were on the product substrate 29 and how many of those bonding sites already have chiplets 22 bonded to them after the completion of block B475. If the product substrate 29 is not finished (B490=No), and thus has bonding sites that are not bonded to chiplets 22, then the second flow returns to block B435. If the product substrate 29 is finished (B490=Yes), and thus there are no more empty bonding sites on the product substrate 29, then the second flow proceeds to block B493.

In block B493, the bonding system 100 unloads the product substrate 29. For example, the one or more processors 151 may send instructions for the product substrate 29 to be unloaded from the product chuck 134 and removed from the bonding system 100. The second flow then returns to block B430 unless there are no more chiplets 22 to be bonded, in which case the second flow ends.

Also, if the product substrate 29 is being bonded with a hybrid-bonding method, a third flow moves from block B493 to block B495. In block B495, the product substrate 29 is heated to cause the metal interconnect contacts to expand relative to the bonding surface and form electrical connections between the chiplets 22 and the product substrate 29. The heating may be performed at 200° C. to 300° C. under some external pressure and in an inert environment to prevent oxidation of metal interconnects. In some embodiments, the heating in block B495 is performed at a higher temperature than the bonding in block B475. The product substrate 29 may then be subjected to one or more additional bonding methods to attach additional chiplets 22 to the product substrate 29. Also, after block B495, the product substrate 29 may be subjected to additional semiconductor processing steps, such as singulation, testing, encapsulation, etc., which are used to produce a plurality of articles from the product substrate 29.

Figure 7:
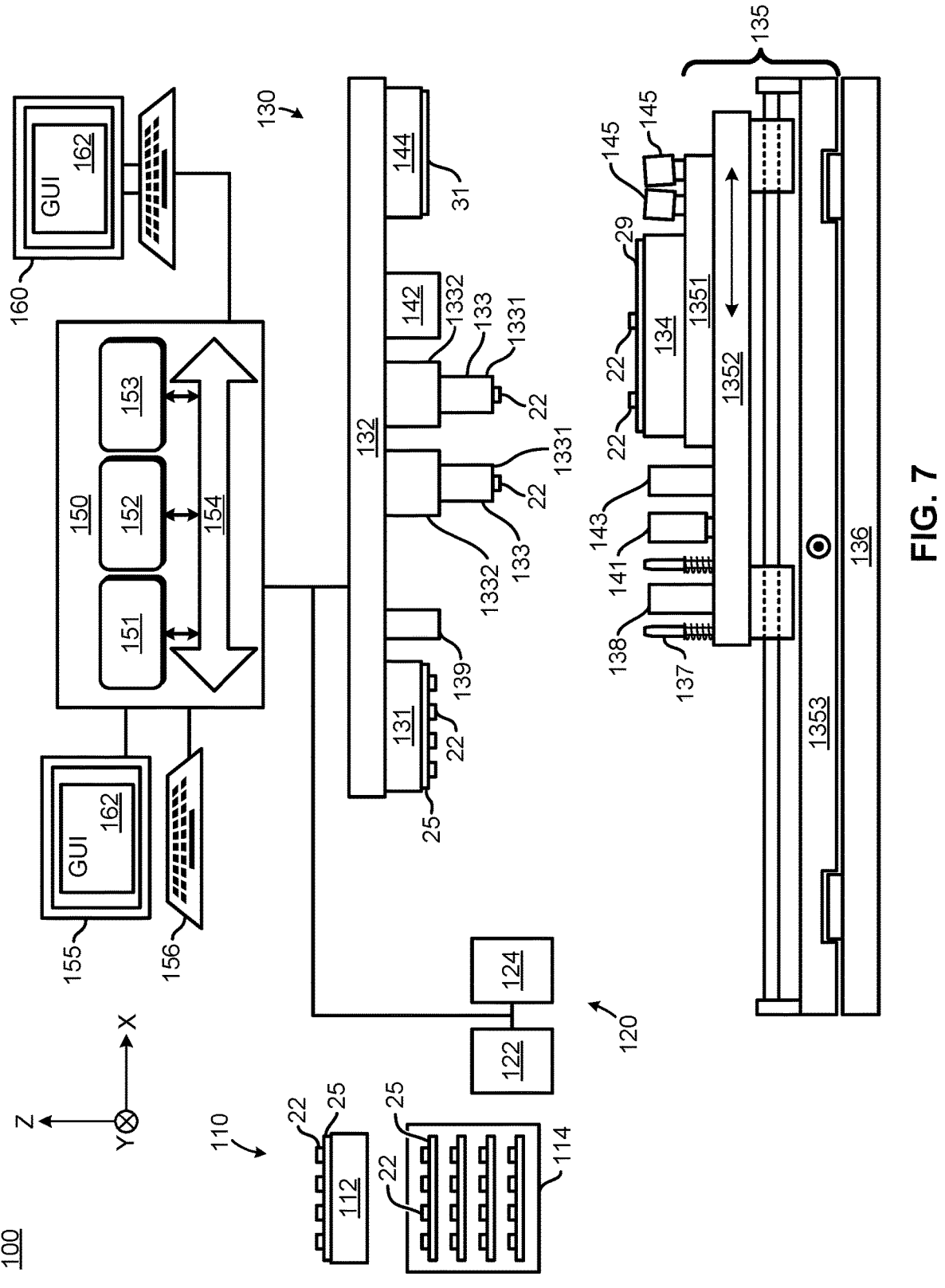
FIG. 7 is an illustration of an example embodiment of a bonding system that is adapted to bond a chiplet to a substrate.

FIG. 7 is an illustration of an example embodiment of a bonding system 100 that is adapted to bond a chiplet to a substrate. This embodiment is similar to the embodiment shown in FIG. 1. However, the bonding system 100 in FIG. 7 includes two or more alignment microscopes 145.

For example, FIG. 8 illustrates an example embodiment of two alignment microscopes 145. The two alignment microscopes 145 constitute a stereoscopic vision system. The alignment microscopes 145 capture images that the bonding system 100 (e.g., the control device 150) can use to generate three-dimensional (3D) images of captured regions of a chiplet surface (e.g., a test region 23 of a test chiplet 22, a reference region 34 of a reference chiplet 33). The 3D images include both image information and shape measurements (non-flatness variations). Thus, a pixel in a 3D image indicates a visual appearance (a pixel's visual value) and three-dimensional coordinates, and a 3D images defines both a visual appearance and a surface topography of a captured region of a chiplet.

And the bonding system may also include two or more upward-facing microscopes 141 that constitute a stereoscopic vision system. The two or more upward-facing microscopes 141 can capture images of entire chiplets (test chiplets 22, reference chiplets 33), which can be used to generate 3D global images of the chiplets.

FIG. 9 illustrates an example embodiment of an operational flow for bonding a chiplet to a substrate. The flow begins in block B900, where a bonding system 100 inspects a product substrate 29 that is held by product chuck 134. The inspection may include obtaining images of the product substrate 29 using a downward-facing microscope 142, and a control device 150 can analyze those images to inspect the product substrate 29 and identify one or more bonding sites on the product substrate 29.

Next, in block B905, the bonding system 100 obtains a three-dimensional (3D) reference image 42 of a reference chiplet 33. The 3D reference image 42 may be a 3D image of a reference region 34 on the surface of the reference chiplet 33. The control device 150 uses captured images from two or more alignment microscopes 145 to generate the 3D reference image 42 of the front surface of the reference chiplet 33 in a global (world) coordinate system (a coordinate system to which all other sub-systems, motions, metrology, etc., are referenced, mapped, calibrated, or registered). As noted above, a 3D image, such as the 3D reference image 42, includes both image information and shape measurements. Typically, the reference chiplet's surface would be flat and have negligible to very small non-flatness variations in the global coordinate system.

The flow then moves to block B910, where the bonding system 100 obtains a 3D test image 43 of a test chiplet 22 that is aligned to the reference chiplet 33. The 3D test image 43 may be a 3D image of a test region 23 on the test chiplet 22. To obtain the 3D test image 43 of the test chiplet 22, the control device 150 uses captured images from two or more alignment microscopes 145 to generate the 3D test image 43 of the front surface of the test chiplet 22 in the global coordinate system.

Then, in block B915, the bonding system 100 obtains (e.g., computes) observed alignment errors and shape differences between the 3D reference image 42 and the 3D test image 43. For example, the control device 150 may perform 3D digital-image correlation using the reference image 42 and the 3D test image 43, and the results of the 3D digital-image correlation are decomposed to indicate both the observed alignment errors and the shape differences between the 3D reference image 42 and the 3D test image 43. The shape differences indicate the non-flatness variations of the test chiplet 22 relative to the reference chiplet 33 (e.g., the non-flatness variations of the test region 23 of the test chiplet 22 relative to the reference region 34 of the reference chiplet 33).

The flow then proceeds to block B920, where the bonding system 100 calculates a curvature-caused component of the observed alignment errors based on the shape differences (e.g., the non-flatness variations of the test region 23 of the test chiplet 22 relative to the reference region 34 of the reference chiplet 33). As described above, calculating the curvature-caused component may include calculating a slope $\theta$ between the surface of the test chiplet 22 and the corresponding surface of the reference chiplet 33. And, as noted above, the slope $\theta$ may be the average slope of the test chiplet 22 in the imaging field of view, the maximum slope of the test chiplet 22 in the imaging field of view, the angle in each of the x-axis and y-axis directions of a plane that is fitted to the topography of the test chiplet 22 in the field of view, or the angle in each of the x-axis and y-axis directions of a plane that is fitted to the edges of the chiplet 22 in the imaging field of view.

Then, in block B925, the bonding system 100 calculates in-plane alignment errors based on the curvature-caused component and on the observed alignment errors, for example by subtracting the curvature-caused component from the observed alignment errors. The flow then moves to block B930, where the bonding system 100 adjusts the in-plane position of the test chiplet 22 based on the in-plane alignment errors. And, in block B935, the bonding system 100 bonds the test chiplet 22 to the product substrate 29.

FIG. 10 illustrates an example embodiment of an operational flow for bonding a chiplet to a substrate. The flow begins in block B1000, where a bonding system 100 uses one or more alignment microscopes 145 to obtain a reference image 42 of a reference region 34 of a reference chiplet 33. Next, in block B1005, the bonding system 100 obtains shape measurements of the reference region 34. For example, the bonding system 100 may use one or more shape-measurements sensors 143 to measure the respective z-axis coordinates of a plurality of locations (e.g., pixels) on the surface of the reference region 34. Furthermore, in some embodiments, the bonding system 100 uses two or more alignment microscopes 145 to obtain a 3D reference image 42 of the reference region 34 in block B1000, and block B1005 may be omitted in such embodiments because the 3D reference image 42 includes the shape measurements of the reference region 34.

In block B1010, the bonding system 100 obtains a measurement of a global tilt of a test chiplet 22 that is held by a bonding-head chiplet chuck 1331 of a bonding head 133. Tilt in the context of the present application means the tip, the tilt, or the tip and the tilt of a bonding surface of the chiplet. For example, the bonding system 100 may use one or more shape-measurement sensors 143 (e.g., displacement-measurement sensors), such as optical sensors, air-gauge sensors, interferometric sensors, capacitive sensors, and spectral-interference sensors, to obtain z-axis measurements across the surface of the test chiplet 22. The sampling frequency of the z-axis measurements may be low (e.g., 5-10 location on the surface of the test chiplet 22). The bonding system 100 may then calculate the global tilt based on the obtained measurements. Also, the bonding system 100 may obtain a 3D global image of the test chiplet 22 and calculate the global tilt based on the 3D global image of the test chiplet 22. For example, the global tilt may be calculated by fitting a plane to the test chiplet 22 or by calculating the mean or median of the respective surface normals of a plurality of locations on a chiplet (e.g., a test chiplet 22, a reference chiplet 33).

Next, in block B1015, the bonding system 100 adjusts the global tilt of the test chiplet 22 based on the global tilt of the test chiplet 22. After block B1015, the test chiplet 22 has no global tilt or has a negligible global tilt (a tilt that is within a tolerance). Also, block B1015 may include an adjustment (a translation) of the position of the test chiplet 22 on the z axis.

The flow then proceeds to block B1020, where the bonding system 100 aligns the tilt-adjusted test chiplet 22 to the reference chiplet 33.

The flow then moves to block B1025, where the bonding system 100 obtains a test image 43 of a test region 23 of the test chiplet 22. And, in block B1030, the bonding system 100 obtains shape measurements of the test region 23. For example, the bonding system 100 may measure the respective z-axis coordinates of a plurality of locations (e.g., pixels) on the surface of the test region 23. Furthermore, in some embodiments, the bonding system 100 obtains a 3D test image 43 of the test region 23 in block B1025, and block B1030 may be omitted in such embodiments because the 3D test image 43 includes shape measurements of the test region 23.

Then, in block B1035, the bonding system 100 obtains (e.g., computes) observed alignment errors between the reference image 42 and the test image 43. And, in block B1040, the bonding system 100 calculates a curvature-caused component of the observed alignment errors based on the shape measurements of the reference region 34 and on the shape measurements of the test region 23. For example, calculating the curvature-caused component may include calculating shape differences that indicate the non-flatness variations of the test region 23 relative to the reference region 34. Also, as described above, calculating the curvature-caused component may include calculating a slope $\theta$ between the surface of the test chiplet 22 and the corresponding surface of the reference chiplet 33.

Then, in block B1045, the bonding system 100 calculates in-plane alignment errors based on the curvature-caused component and on the observed alignment errors, for example by subtracting the curvature-caused component from the observed alignment errors. The flow then moves to block B1050, where the bonding system 100 adjusts the in-plane position of the test chiplet 22 based on the in-plane alignment errors by translating the test chiplet 22 on one or more of the x and y axes or by rotating the test chiplet 22 around the z axis.

Next, in block B1055, the bonding system 100 measures a tilt of a product substrate 29 at a bonding site (the bonding site of the test chiplet 22). The tilt of the product substrate 29 may be measured with the downward-facing alignment system 139 or the downward-facing microscope 142, or the tilt of the product substrate 29 may be received by the processors 151 based on previous measurements of the product substrate 29 outside of the bonding system 100. And, in block B1060, the bonding system 100 adjusts the global tilt of the test chiplet 22 to match the tilt of the product substrate 29 at the bonding site.

Then, in block B1065, the bonding system 100 bonds the test chiplet 22 to the product substrate 29.

FIG. 11 illustrates an example embodiment of an operational flow for bonding a chiplet to a substrate. The flow begins in block B1100, where a bonding system 100 obtains a 3D reference image 42 of a reference region 34 of a reference chiplet 33.

The flow then moves to block B1105, where the bonding system 100 obtains a 3D global image of a test chiplet 22 that is held by a bonding-head chiplet chuck 1331 of a bonding head 133. The control device 150 uses captured images from two or more upward-facing microscopes 141 to generate the 3D global image of the test chiplet 22.

The flow then moves to block B1110, where the bonding system 100 calculates a global tilt of the test chiplet 22 relative to the reference chiplet 33, which may be assumed to be level, based on the 3D global image of the test chiplet 22. For example, in some embodiments, the bonding system 100 obtains a 3D global image of the reference chiplet 33 and calculates the global tilt of the test chiplet 22 by comparing the 3D global image of the test chiplet 22 to the 3D global image of the reference chiplet 33, for example using 3D DIC. To calibrate the bonding system 100 to perform 3D DIC, multiple images of planar dot patterns with spacing may be used to obtain one or more of the intrinsic properties of the stereoscopic vision system (e.g., two or more upward-facing microscopes 141, two or more alignment microscopes 145). Examples of intrinsic properties include the following: the image-plane center locations for each imaging device (e.g., upward-facing microscope 141, alignment microscope 145), scale factors in horizontal and vertical directions for each imaging device, the skew-imaging distortion of each imaging device, the radial-distortion coefficients of each imaging device, the relative orientation of each imaging device to every other imaging device, and the relative position of each imaging device to every other imaging device.

Also for example, the global tilt may be calculated as an average of the out-of-plane differences between a level reference plane and the 3D global image of the test chiplet 22.

Next, in block B1115, the bonding system 100 adjusts the global tilt of the test chiplet 22. The adjustment to the global tilt reduces or eliminates the global tilt of the test chiplet 22 relative to the reference plane (e.g., relative to the reference chiplet 33).

The flow then moves to block B1120, where the bonding system 100 aligns the tilt-adjusted test chiplet 22 to the reference chiplet 33. And, in block B1125, the bonding system 100 obtains a 3D test image 43 of a test region 23 of the test chiplet 22.

In block B1130, the bonding system 100 obtains observed alignment errors at the adjusted tilt based on the 3D test image 43 of the test region 23 of the test chiplet 22 and on the 3D reference image 42 of the reference region 34 of the reference chiplet 33, for example using 3D DIC.

The flow then proceeds to block B1135, where the bonding system 100 calculates a curvature-caused component of the observed alignment errors at the adjusted tilt based on the 3D test image 43 of the test region 23 of the test chiplet 22 and on the 3D reference image 42 of the reference region 34 of the reference chiplet 33, for example using 3D DIC.

Then, in block B1140, the bonding system 100 calculates in-plane alignment errors at the adjusted tilt based on the curvature-caused component and on the observed alignment errors at the adjusted tilt, for example by subtracting the curvature-caused component from the observed alignment errors. The flow then moves to block B1145, where the bonding system 100 adjusts the in-plane position of the test chiplet 22 based on the in-plane alignment errors.

Next, in block B1150, the bonding system 100 measures a tilt of a product substrate 29 at a bonding site where the test chiplet 22 will be bonded. Then, in block B1155, the bonding system 100 adjusts the global tilt of the test chiplet 22 to match the tilt of the product substrate 29 at the bonding site.

And, in block B1160, the bonding system 100 bonds the test chiplet 22 to the product substrate 29.

Furthermore, some embodiments of the operational flow in FIG. 10 omit block B1015, and some embodiments of FIG. 11 omit block B1115. In such embodiments (in block B1045 in FIG. 10 and in block B1140 in FIG. 11), the calculation of the in-plane alignment error is further based on the global tilt of the test chiplet 22. For example, in some embodiments, the relationship between the in-plane alignment error, the observed alignment error, the curvature-caused component, and the global tilt may be described by the following:

$$err_{ip} = err_{ob} - cc - r*(1 - \cos\alpha), \tag{9}$$

where $err_{ip}$ is the in-plane alignment error, where $err_{ob}$ is the observed alignment error, where cc is the curvature-caused component, where a is the global tilt of the test chiplet 22, and where r is the distance from the center of the test chiplet 22 to the test region 23. Also, the magnification or scaling of the field of view of the test image 43 of the test region 23 may be adjusted, for example as described by the following:

$$FOV_{new} = FOV_{old} * \cos\alpha, \tag{10}$$

where $FOV_{new}$ is the adjusted field of view of the test image 43, where $FOV_{old}$ is the filed of view of the captured test image 43, and where a is the global tilt of the test chiplet 22.

FIG. 12 illustrates an example embodiment of an operational flow for bonding a chiplet to a substrate. The flow begins in block B1200, where a bonding system 100 identifies a bonding site on a product substrate 29 that is held by product chuck 134. For example, a downward-facing microscope 142 may capture images of the product substrate 29, and a control device 150 can identify one or more bonding sites on the product substrate 29 in the images.

Next, in block B1205, the bonding system 100 obtains respective test images 43 of one or more test regions 23 of a test chiplet 22 that is held by a bonding head 133 using one or more upward-facing microscopes 141.

The flow then moves to block B1210, where the bonding system 100 obtains shape measurements (e.g., the surface profiles) of the one or more test regions 23 of the test chiplet 22. For example, one or more shape-measurement sensors 143 may obtain respective measurements of the flatness or shape of each of the one or more test regions 23 on the test chiplet 22.

Then, in block B1215, the bonding system 100 determines the alignment of the test chiplet 22 to the bonding site on the product substrate 29. For example, a control device 150 and a downward-facing alignment system 139 can measure the positions of a substrate set of interconnect contacts on the product substrate 29 relative to the product chuck 134, and the control device 150 and an upward-facing alignment system 138 can measure the positions of a chiplet set of interconnect contacts on the test chiplet 22 relative to the transfer chuck 131. And, because the product chuck 134 and the test chuck 131 are registered to each other, the control device 150 can then determine the alignment of the test chiplet 22 to the bonding site. The output of block B1215 indicates the relative positions of the substrate set of interconnect contacts on the product substrate 29 to the chiplet set of interconnect contacts on the test chiplet 22 at the current alignment of the product chuck 134 and the bonding head 133 that holds the test chiplet 22.

In block B1220, the bonding system 100 determines observed alignment errors based on the relative positions of the substrate set of interconnect contacts on the product substrate 29 to the chiplet set of interconnect contacts on the test chiplet 22 at the current alignment of the product chuck 134 and the bonding head 133 that holds the test chiplet 22.

The flow then proceeds to block B1225, where the bonding system 100 calculates a curvature-caused component of the observed alignment errors based on the shape measurements of the one or more test regions 23 of the test chiplet 22 and on a reference surface (e.g., a plane) that is used as a point of reference to determine non-flatness variations (e.g., slopes) on the surface of the test chiplet 22 in the one or more test regions 23.

Then, in block B1230, the bonding system 100 calculates in-plane alignment errors based on the curvature-caused component and on the observed alignment errors, for example by subtracting the curvature-caused component from the observed alignment errors. The flow then moves to block B1235, where the bonding system 100 adjusts the in-plane position of the test chiplet 22 based on the in-plane alignment errors, for example by controlling a bonding-head chiplet stage 1332 of the bonding head 133 that holds the test chiplet 22 to move (to rotate or to translate). And, in block B1240, the bonding system 100 bonds the test chiplet 22 to the bonding site of the product substrate 29.

FIG. 13 illustrates an example embodiment of an operational flow for bonding a chiplet to a substrate. The flow begins in block B1300, where a bonding system 100 identifies a bonding site on a product substrate 29 that is held by product chuck 134.

Next, in block B1305, the bonding system 100 obtains respective 3D test images 43 of one or more test regions 23 of a test chiplet 22 that is held by a bonding head 133 using two or more alignment microscopes 145.

Then, in block B1310, the bonding system 100 determines the alignment of the test chiplet 22 to the bonding site on the product substrate 29. The output of block B1310 indicates the relative positions of the substrate set of interconnect contacts on the product substrate 29 to the chiplet set of interconnect contacts on the test chiplet 22 at the current alignment of the product chuck 134 and the bonding head 133 that holds the test chiplet 22.

In block B1315, the bonding system 100 determines observed alignment errors based on the relative positions of the substrate set of interconnect contacts on the product substrate 29 to the chiplet set of interconnect contacts on the test chiplet 22 at the current alignment of the product chuck 134 and the bonding head 133 that holds the test chiplet 22.

The flow then proceeds to block B1320, where the bonding system 100 calculates a curvature-caused component of the observed alignment errors based on the 3D images of the one or more test regions 23 of the test chiplet 22 and on a reference surface (e.g., a plane) that is used as a point of reference to determine non-flatness variations (e.g., slopes) on the surface of the test chiplet 22 in the one or more test regions 23.

Then, in block B1325, the bonding system 100 calculates in-plane alignment errors based on the curvature-caused component and on the observed alignment errors, for example by subtracting the curvature-caused component from the observed alignment errors. The flow then moves to block B1330, where the bonding system 100 adjusts the in-plane position of the test chiplet 22 based on the in-plane alignment errors, for example by controlling a bonding-head chiplet stage 1332 of the bonding head 133 that holds the test chiplet 22 to move (to rotate or to translate). And, in block B1335, the bonding system 100 bonds the test chiplet 22 to the product substrate 29.

Figure 14:
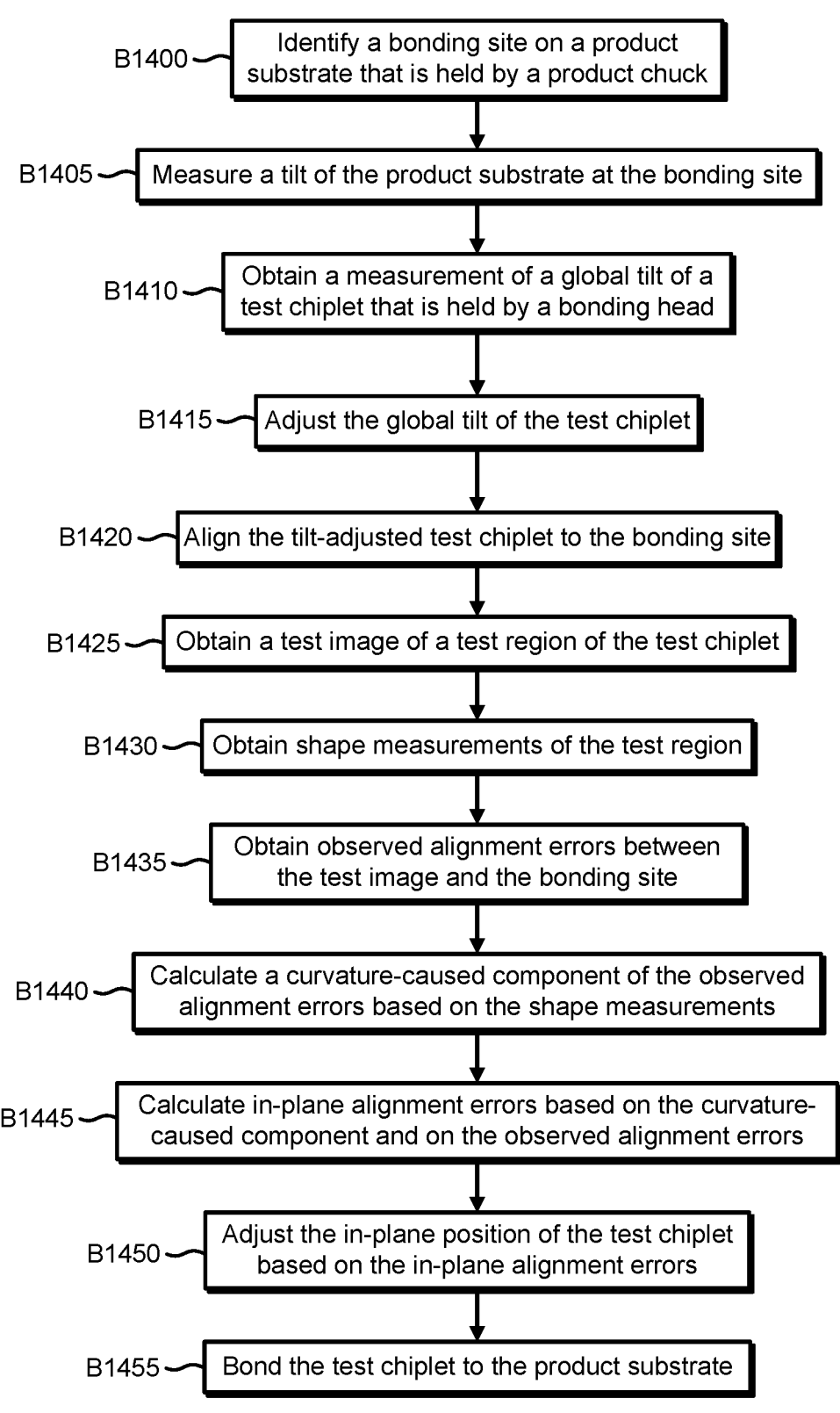
FIG. 14 illustrates an example embodiment of an operational flow for bonding a chiplet to a substrate.

FIG. 14 illustrates an example embodiment of an operational flow for bonding a chiplet to a substrate. The flow begins in block B1400, where a bonding system 100 identifies a bonding site on a product substrate 29 that is held by product chuck 134.

Next, in block B1405, the bonding system 100 measures a tilt of the product substrate 29 at the bonding site. The tilt is measured relative to a reference plane (e.g., the x-y plane).

In block B1410, the bonding system 100 obtains a measurement of a global tilt of a test chiplet 22 that is held by a bonding head 133 relative to the reference plane. The flow then moves to block B1415, where the bonding system 100 adjusts the tilt of the test chiplet 22 based on the global tilt of the test chiplet 22 and on the tilt at the bonding site of the product substrate 29. The tilt of the test chiplet 22 may be adjusted to minimize a tilt difference between the global tilt of the test chiplet 22 and the tilt at the bonding site of the product substrate 29.

Next, in block B1420, the bonding system 100 aligns the tilt-adjusted test chiplet 22 to the bonding site. And in block B1425, the bonding system 100 obtains a test image 43 of a test region 23 of the tilt-adjusted test chiplet 22.

And, in block B1430, the bonding system 100 obtains shape measurements of the test region 23. For example, the bonding system 100 may measure the respective z-axis coordinates of a plurality of locations (e.g., pixels) in the test region 23. Furthermore, in some embodiments, the bonding system 100 obtains a 3D test image 43 of the test region 23 in block B1425, and block B1430 may be omitted in such embodiments because the 3D test image 43 includes shape measurements of the test region 23.

Then, in block B1435, the bonding system 100 obtains (e.g., computes) observed alignment errors between the reference image 42 and the test image 43. Block B1435 may include determining the relative positions of the substrate set of interconnect contacts on the product substrate 29 to the chiplet set of interconnect contacts on the tilt-adjusted test chiplet 22 at the current alignment of the product chuck 134 and the bonding head 133 that holds the tilt-adjusted test chiplet 22.

And, in block B1440, the bonding system 100 calculates a curvature-caused component of the observed alignment errors based on the shape measurements of the test region 23 and on a reference surface (e.g., a plane) that is used as a point of reference to determine non-planar variations on the surface of the test chiplet 22 in the test region 23.

Then, in block B1445, the bonding system 100 calculates in-plane alignment errors based on the curvature-caused component and on the observed alignment errors, for example by subtracting the curvature-caused component from the observed alignment errors. The flow then moves to block B1450, where the bonding system 100 adjusts the in-plane position of the test chiplet 22 based on the in-plane alignment errors. And, in block B1450, the bonding system 100 bonds the test chiplet 22 to the bonding site of the product substrate 29.

Figure 15:
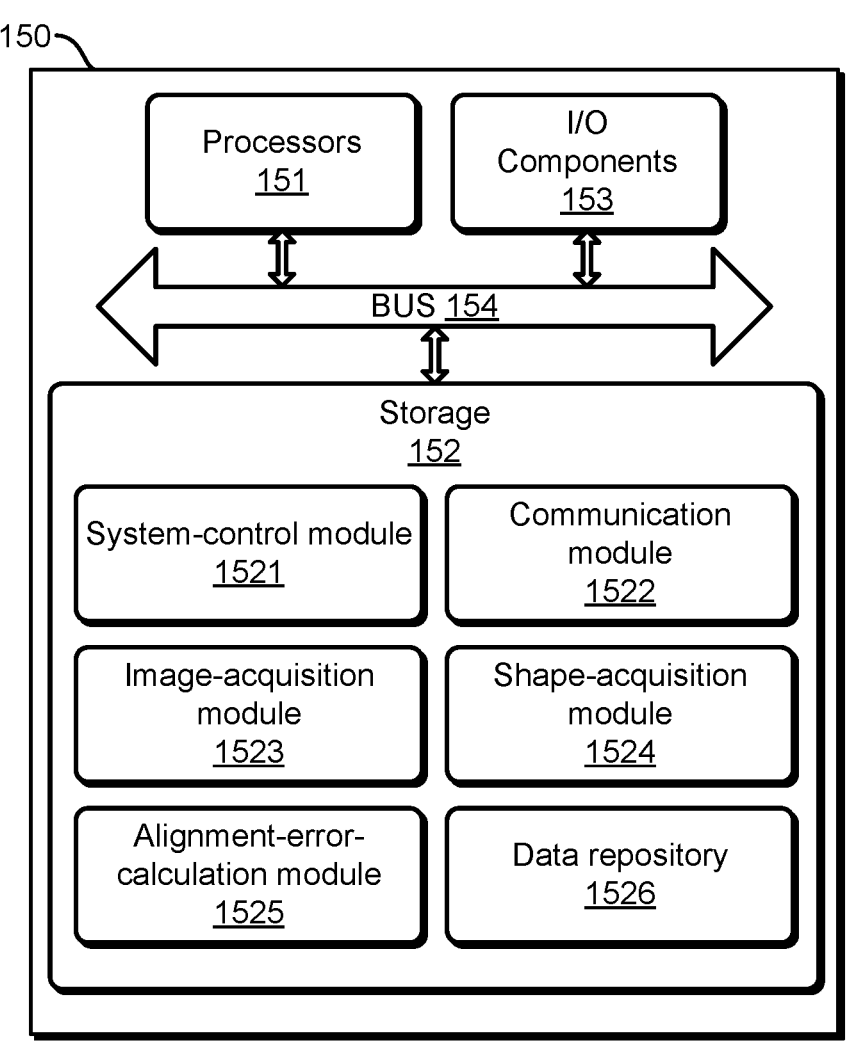
FIG. 15 is a schematic illustration of an example embodiment of a control device.

FIG. 15 is a schematic illustration of an example embodiment of a control device 150. The control device 150 includes one or more processors 151, one or more computer-readable storage media 152, one or more I/O components 153, and a bus 154.

The control device 150 additionally includes a system-control module 1521, a communication module 1522, an image-acquisition module 1523, a shape-acquisition module 1524, and an alignment-error-calculation module 1525. As used herein, a module includes logic, computer-readable data, or computer-executable instructions. In the embodiment shown in FIG. 15, the modules are implemented in software (e.g., Assembly, C, C++, C#, Java, JavaScript, BASIC, Perl, Visual Basic, Python, PHP). However, in some embodiments, the modules are implemented in hardware (e.g., customized circuitry) or, alternatively, a combination of software and hardware. When the modules are implemented, at least in part, in software, then the software can be stored in the one or more computer-readable storage media 152. Also, in some embodiments, the control device 150 includes additional or fewer modules, the modules are combined into fewer modules, or the modules are divided into more modules. And a module may use (e.g., call) other modules. Also, the control device 150 includes a data repository 1526, which stores information about chiplets and substrates, such as the number of chiplets that are on a substrate, the number of bonding sites on a substrate, and the forms and locations of alignment marks on chiplets and substrates.

The system-control module 1521 includes instructions that cause the applicable components (e.g., the one or more processors 151, the storage 152, the I/O components 153) of the control device 150 to communicate with and to control the other members of a bonding system 100. And the applicable components operating according to the system-control module 1521 realize an example of a system-control unit.

The communication module 1522 includes instructions that cause the applicable components (e.g., the one or more processors 151, the storage 152, the I/O components 153) of the control device 150 to communicate with one or more other devices, such as other computing devices (e.g., the networked computer 160 in FIG. 1) and input or output devices (e.g., the display 155 and the keyboard 156 in FIG. 1). And the applicable components operating according to the communication module 1522 realize an example of a communication unit.

The image-acquisition module 1523 includes instructions that cause the applicable components (e.g., the one or more processors 151, the storage 152, the I/O components 153) of the control device 150 to control the components of the bonding system 100 to capture images of test chiplets 22 (e.g., images of test regions 23, global images) and reference chiplets 33 (e.g., images of reference regions 34, global images). For example, some embodiments of the image-acquisition module 1523 include instructions that cause the applicable components of the control device 150 to control the bonding system 100 to perform at least some of the operations that are described in blocks B420 and B440 in FIG. 4, in blocks B905 and B910 in FIG. 9, in blocks B1000 and B1025 in FIG. 10, in blocks B1100-B1105 and B1125 in FIG. 11, in block B1205 in FIG. 12, in block B1305 in FIG. 13, and in block B1425 in FIG. 14. And the applicable components operating according to the image-acquisition module 1523 realize an example of an image-acquisition unit.

The shape-acquisition module 1524 includes instructions that cause the applicable components (e.g., the one or more processors 151, the storage 152, the I/O components 153) of the control device 150 to control the components of the bonding system 100 to acquire shape measurements and tilt measurements for a test chiplet 22, a reference chiplet 33, and a bonding site on a product substrate 29. This may include obtaining information from one or more shape-measurement sensors 143 or generating 3D images from images that were captured using two or more upward-facing microscopes 141 that constitute a stereoscopic vision system or from two or more alignment microscopes 145 that constitute a stereoscopic vision system. For example, some embodiments of the shape-acquisition module 1524 include instructions that cause the applicable components of the control device 150 to control the bonding system 100 to perform at least some of the operations that are described in blocks B425 and B445 in FIG. 4; in blocks B905 and B910 in FIG. 9; in blocks B1005, B1010, B1030, and B1055 in FIG. 10; in blocks B1105 and B1110 in FIG. 11; in block B1210 in FIG. 12; in block B1305 in FIG. 13; and in blocks B1405-B1410 and B1430 in FIG. 14. And the applicable components operating according to the shape-acquisition module 1524 realize an example of a shape-acquisition unit.

The alignment-error-calculation module 1525 includes instructions that cause the applicable components (e.g., the one or more processors 151, the storage 152, the I/O components 153) of the control device 150 to control the components of the bonding system 100 to calculate observed alignment errors, calculate curvature-caused components and in-plane alignment errors from observed alignment errors, adjust in-plane positions of test chiplets 22, and adjust global tilts of test chiplets 22. For example, some embodiments of the alignment-error-calculation module 1525 include instructions that cause the applicable components of the control device 150 to control the bonding system 100 to perform at least some of the operations that are described in blocks B450-B470 in FIG. 4; in blocks B915-B930 in FIG. 9; in blocks B1035-B1050 and B1060 in FIG. 10; in blocks B1110-B1115, B1130-B1145, and B1155 in FIG. 11; in blocks B1220-B1235 in FIG. 12; in blocks B1315-B1330 in FIG. 13; and in blocks B1415 and B1435-B1450 in FIG. 14. And the applicable components operating according to the alignment-error-calculation module 1525 realize an example of an alignment-error-calculation unit.

At least some of the above-described devices, systems, and methods can be implemented, at least in part, by providing one or more computer-readable media that contain computer-executable instructions for realizing the above-described operations to one or more computing devices that are configured to read and execute the computer-executable instructions. The systems or devices perform the operations of the above-described embodiments when executing the computer-executable instructions. Also, an operating system on the one or more systems or devices may implement at least some of the operations of the above-described embodiments.

Furthermore, some embodiments use one or more functional units to implement the above-described devices, systems, and methods. The functional units may be implemented in only hardware (e.g., customized circuitry) or in a combination of software and hardware (e.g., a microprocessor that executes software).

In the description, specific details are set forth in order to provide a thorough understanding of the embodiments disclosed. However, well-known methods, procedures, components and circuits may not have been described in detail in order to avoid unnecessarily lengthening the present disclosure.

Also, if a member (e.g., element, part, component) is referred herein as being "on," "against," "connected to," or "coupled to" another member, then the member can be directly on, against, connected or coupled to the other member, but intervening members may also be present between the member and the other member. In contrast, if a member is referred to as being "directly on," "directly against," "directly connected to," or "directly coupled to" another member, then there are no intervening members present between the member and the other member.

Furthermore, the terms "comprising," "having," "includes," "including," and "containing" are to be construed as open-ended terms unless otherwise noted. Accordingly, these terms, when used in the present specification, specify the presence of described features, integers, steps, operations, elements, materials, or members, but do not preclude the presence or addition of one or more other features, integers, steps, operations, elements, materials, or members that are not explicitly described.

The invention claimed is:

1. A method of aligning a chiplet to a substrate, the method comprising:

obtaining an image of a region on a chiplet;

measuring a deviation from planarity of the region on the chiplet;

27 estimating a chiplet-position error of the chiplet based on the image of the region and the deviation from planarity of the region, wherein estimating the chiplet-position error comprises:

obtaining an observed alignment error of the region based on the image of the region, calculating a component of the observed alignment error that is caused by the deviation from planarity of the region, and calculating an in-plane alignment error by subtracting the component from the observed alignment error; and controlling at least one of a bonding head that holds the chiplet or a substrate stage that holds the substrate to adjust a relative position of the chiplet and the substrate based on the chiplet-position error.

2. The method of claim 1, wherein estimating the chiplet-position error of the chiplet is further based on a reference surface.

3. The method of claim 2, wherein the reference surface is an image of a region of a reference chiplet.

4. The method of claim 2, wherein obtaining the observed alignment error comprises:

calculating an alignment difference between the image of the region on the chiplet and the reference surface, wherein the alignment difference includes one or both of a translation difference and a rotation difference.

5. The method of claim 4, wherein calculating the component of the observed alignment error comprises:

adjusting the alignment difference based on the deviation from planarity of the region.

6. The method of claim 5, wherein adjusting the alignment difference based on the deviation from planarity of the region includes subtracting a component of the alignment difference that is caused by the deviation from planarity of the region.

7. The method of claim 1, wherein the chiplet is held by a bonding head.

8. A system comprising:

one or more processors; and one or more memories, wherein the one or more processors and the one or more memories are configured to:

obtain an image of a region on a chiplet;

measure a deviation from planarity of the region on the chiplet;

calculate a chiplet-position error of the chiplet based on the image of the region and the deviation from planarity of the region, wherein, to calculate the chiplet-position error, the one or more processors and the one or more memories are configured to:

obtain an observed alignment error of the region based on the image of the region, calculate a component of the observed alignment error that is caused by the deviation from planarity of the region, and calculate an in-plane alignment error by subtracting the component from the observed alignment error; and control at least one of a bonding head that holds the chiplet or a substrate stage that holds a substrate to adjust a relative position of the chiplet and the substrate based on the chiplet-position error.

9. The system of claim 8, wherein the chiplet-position error of the chiplet is calculated further based on a reference surface.

10. The system of claim 9, wherein the reference surface is an image of a region of a reference chiplet.

11. The system of claim 9, wherein, to obtain the observed alignment error, the one or more processors and the one or more memories are configured to:

calculate an alignment difference between the image of the region on the chiplet and the reference surface, wherein the alignment difference includes one or both of a translation difference and a rotation difference.

12. The system of claim 11, wherein, to calculate the component of the observed alignment error, the one or more processors and the one or more memories are further configured to:

adjust the alignment difference based on the deviation from planarity of the region.

13. The system of claim 12, wherein, to adjust the alignment difference based on the deviation from planarity of the region, the one or more processors and the one or more memories are further configured to subtract a component of the alignment difference that is caused by the deviation from planarity of the region.

14. The system of claim 8, further comprising:

a bonding head, wherein the chiplet is held by the bonding head.

15. One or more non-transitory computer-readable storage media storing instructions that, when executed by one or more computing devices, cause the one or more computing devices to perform operations comprising:

obtaining an image of a region on a chiplet;

measuring a surface relief of the region on the chiplet;

calculating a chiplet-position error of the chiplet based on at least the image of the region, the surface relief of the region, and a reference surface, wherein calculating the chiplet-position error comprises:

obtaining an observed alignment error of the region based on the image of the region, calculating a component of the observed alignment error that is caused by the surface relief of the region, and calculating an in-plane alignment error by subtracting the component from the observed alignment error;

calculating a position-adjustment value for the chiplet based on the chiplet-position error; and controlling at least one of a bonding head that holds the chiplet or a substrate stage that holds a substrate to adjust a relative position of the chiplet and the substrate based on the position-adjustment value.

16. The one or more non-transitory computer-readable storage media of claim 15, wherein calculating the position-adjustment value for the chiplet includes calculating a surface-relief component of the chiplet-position error based on the surface relief of the region, wherein the surface-relief component is caused by a difference between the surface relief of the region on the chiplet and the reference surface.

17. The one or more non-transitory computer-readable storage media of claim 16, wherein calculating the position-adjustment value for the chiplet further includes calculating an in-plane-translation difference and an in-plane-rotation difference of the region, wherein calculating the in-plane-translation difference and the in-plane-rotation difference of the region includes subtracting the surface-relief component from the chiplet-position error.

18. The one or more non-transitory computer-readable storage media of claim 17, wherein the in-plane-translation difference and the in-plane-rotation difference define the position-adjustment value.

19. The one or more non-transitory computer-readable storage media of claim 16, wherein the reference surface is a surface of a reference chiplet or an ideal planar surface.

\* \* \* \* \*